United States Patent
Patel et al.

(10) Patent No.: US 6,849,471 B2
(45) Date of Patent: Feb. 1, 2005

(54) BARRIER LAYERS FOR MICROELECTROMECHANICAL SYSTEMS

(75) Inventors: Satyadev R. Patel, Sunnyvale, CA (US); Jonathan C. Doan, Mountain View, CA (US)

(73) Assignee: Reflectivity, Inc., Sunnyvale, CA (US)

( * ) Notice: Subject to any disclaimer, the term of this patent is extended or adjusted under 35 U.S.C. 154(b) by 0 days.

(21) Appl. No.: 10/402,789

(22) Filed: Mar. 28, 2003

(65) Prior Publication Data

US 2004/0191937 A1 Sep. 30, 2004

(51) Int. Cl.[7] .............................................. H01L 21/00
(52) U.S. Cl. ......................................... 438/21; 257/536
(58) Field of Search .......................... 438/21, 421–422; 257/536–537; 347/1, 20, 63

(56) References Cited

U.S. PATENT DOCUMENTS

| | | |
|---|---|---|
| 3,511,727 A | 5/1970 | Hays |
| 4,190,488 A | 2/1980 | Winters |
| 4,310,380 A | 12/1982 | Flamm et al. |
| 4,498,953 A | 2/1985 | Cook et al. |
| 5,439,553 A | 8/1995 | Grant et al. |
| 5,726,480 A | 3/1998 | Pister |
| 5,835,256 A | 11/1998 | Huibers |
| 6,051,503 A | 4/2000 | Bhardwaj |
| 6,115,172 A | 9/2000 | Jeong |
| 6,162,367 A | 12/2000 | Tai et al. |
| 6,197,610 B1 | 3/2001 | Toda |
| 6,204,080 B1 | 3/2001 | Hwang |
| 6,238,581 B1 | 5/2001 | Hawkins et al. |
| 6,290,864 B1 | 9/2001 | Patel et al. |
| 6,355,181 B1 | 3/2002 | McQuarrie |

(List continued on next page.)

FOREIGN PATENT DOCUMENTS

| | | |
|---|---|---|
| EP | 0704884 A2 | 4/1996 |
| EP | 0822582 A2 | 2/1998 |
| EP | 0822584 A2 | 4/1998 |
| EP | 0878824 A2 | 11/1998 |
| EP | 0878824 A3 | 1/2000 |
| JP | 1982/57098679 A | 6/1982 |
| JP | 1983/58130529 A | 8/1983 |
| JP | 1985/60057938 A | 4/1985 |
| JP | 1986/61053732 A | 3/1986 |
| JP | 1986/61134019 A | 6/1986 |
| JP | 1986/61181131 A | 8/1986 |
| JP | 1986/61187238 A | 8/1986 |
| JP | 1986/61270830 A | 12/1986 |
| JP | 1987/62071217 A | 4/1987 |
| JP | 1988/63155713 A | 6/1988 |

(List continued on next page.)

OTHER PUBLICATIONS

Aliev et al., "Development of Si(100) Surface Roughness at the Initial Stage of Etching in F2 and XeF2 Gases Elipsometric Study", Surface Science 442 (1999), pp. 206–214.

Glidemeister, J.M., "Xenon Difluoride Etching System" (Nov. 17, 1997).

Habuka et al., "Dominant Overall Chemical Reaction in a Chlorine Trifluoride–Silicon–Nitrogen System at Atmospheric Pressure", Japan Journal of Applied Physics vol. 38 (1999), pp. 6466–6469.

(List continued on next page.)

*Primary Examiner*—David Nelms
*Assistant Examiner*—David Vu
(74) *Attorney, Agent, or Firm*—Gregory R. Muir

(57) ABSTRACT

A method for processing microelectromechanical devices is disclosed herein. The method prevents the diffusion and interaction between sacrificial layers and structure layers of the microelectromechanical devices by providing selected barrier layers between consecutive sacrificial and structure layers.

63 Claims, 10 Drawing Sheets

U.S. PATENT DOCUMENTS

| | | | |
|---|---|---|---|
| 6,396,619 | B1 | 5/2002 | Huibers et al. |
| 6,409,876 | B1 | 6/2002 | McQuarrie et al. |
| 6,436,229 | B2 | 8/2002 | Tai et al. |
| 6,500,356 | B2 | 12/2002 | Goto et al. |
| 6,576,489 | B2 | 6/2003 | Leung et al. |
| 6,627,467 | B2 * | 9/2003 | Haluzak et al. ............... 438/21 |
| 2001/0002663 | A1 | 6/2001 | Tai et al. |
| 2002/0033229 | A1 | 3/2002 | Lebouitz et al. |
| 2002/0047172 | A1 | 4/2002 | Reid |
| 2002/0121502 | A1 | 9/2002 | Patel et al. |
| 2002/0164879 | A1 | 11/2002 | Leung et al. |
| 2002/0183051 | A1 | 12/2002 | Gopal et al. |
| 2002/0185699 | A1 | 12/2002 | Reid |
| 2002/0196524 | A1 | 12/2002 | Huibers et al. |
| 2003/0054588 | A1 | 3/2003 | Patel et al. |
| 2003/0071015 | A1 | 4/2003 | Chinn et al. |
| 2003/0077878 | A1 | 4/2003 | Kumar et al. |
| 2003/0124848 | A1 | 7/2003 | Chinn et al. |
| 2003/0166342 | A1 | 9/2003 | Chinn et al. |
| 2003/0219986 | A1 | 11/2003 | Rattner et al. |

FOREIGN PATENT DOCUMENTS

| | | |
|---|---|---|
| JP | 1989/01208834 A | 8/1989 |
| JP | 1989/10217921 A | 8/1989 |
| JP | 1990/02250323 A | 10/1990 |
| JP | 1991/03012921 A | 1/1991 |
| JP | 1992/04096222 A | 3/1992 |
| JP | 1995/07029823 A | 1/1995 |
| JP | 1997/09251981 A | 9/1997 |
| JP | 1998/10313128 A | 11/1998 |
| JP | 1998/10317169 A | 12/1998 |
| WO | WO-98/32163 | 7/1998 |
| WO | WO-99/49506 | 9/1999 |

OTHER PUBLICATIONS

Hecht et al., "A Novel X-ray Photoelectron Spectroscopy Study of the Al/SiO2 Interface", J. Appl. Phys. vol. 57 (Jun. 15, 1985), pp. 5256–5261.

Houle, F.A., "Dynamics of SiF4 Desorption During Etching of Silicon by XeF2", IBM Almaden Research Center (Apr. 15, 1987), pp. 1866–1872.

Flamm et al., "XeF2 and F–Atom Reactions with Si: Their Significance for Plasma Etching", Solid State Technol. 26, 117 (1983).

Ibbotson et al., "Plasmaless Dry Etching of Silicon with Fluorine-containing Compounds", J. Appl. Phys. vol. 56 No. 10 (Nov. 1984), pp. 2939–2942.

Ibbotson et al., "Comparison of XeF2 and F–atom Reactions with Si and SiO2", Applied Physics Letter, vol. 44, 1129 (1984).

Streller et al., "Selectivity in Dry Etching of Si (100) and XeF2 and VUV Light", Elsevier Science B.V., Applied Surface Science vol. 106 (1996), pp. 341–346.

Vugts et al., "Si/XeF2 Etching: Temperature Dependence", J. Vac. Sci. Technol. A 14(5) (Sep./Oct. 1996), pp. 2766–2774.

Winters, H.F., "Etch Products from the Reaction of XeF2 with SiO2, SiO3, Si3N4, SiC, and Si in the Presence of Ion Bombardment", J. Vac. Sci. Technol. B 1(4) (Oct./Dec. 1983), pp. 927–931.

Kurt Williams, Etch Rates for Micromachining Processing–Part II, 2003 IEEE, pp. 761–778, Journal of Microelectromechanical Systems, vol. 12, No. 6, Dec. 2003.

Winters et al., "The Etching of Silicon with XeF2 Vapor", Appl. Phys. Letter, vol. 34(1) (Jan. 1, 1979), pp. 70–73.

Xactix, Inc., Marketing Brochure (Jun. 27, 1999).

"Xenon Difluoride Isotropic Etch System: Seeing is Believing", Surface Technology Systems Ltd. brochure, Newport, UK (date unknown).

Chu et al., "Controlled Pulse–Etching with Xenon Difluoride", International Solid State Sensors and Actuators Conference (Transducers '97), Chicago, IL, vol. 1 (Jun. 16–19, 1997), pp. 665–668 (abstract only).

Bassom et al., "Modeling and Optimizing XeF2–enhanced FIB Milling of Silicon", 25th International Symposium for Testing and Failure Analysis, Santa Clara, CA (Nov. 14–18, 1999), pp. 255–261 (abstract only).

Kohler et al., "Fabrication of Microlenses by Plasmaless Isotropic Etching Combined with Plastic Moulding", Sens. Actuators A, Phys. (Switzerland), vol. A53, No. 1–3 (May 1996), pp. 361–363 (abstract only).

Chan et al., "Gas Phase Pulse Etching of Silicon for MEMS with Xenon Difluoride", Engineering Solutions for the Next Millenium: 1999 IEEE Canadian Conference on Electrical and Computer Engineering, Edmonton, Alberta, vol. 3 (May 9–12, 1999), pp. 1637–1642 (abstract only).

Chang et al., "Gas–Phase Silicon Micromachining with Silicon Difluroide", Proceedings of the SPIE –The International Socity for Optical Engineering, vol. 2641 (1995), pp. 117–128 (abstract only).

Sebel et al., "Reaction Layer Dynamics in Ion–Assisted Si/XeF2 Etching: Temperature Dependence", J. Vac. Sci. Technol. A, Vac. Surf, Films, vol. 18, No. 6 (Nov. 2000), pp. 2759–2769 (abstract only).

Sebel et al., "Silicon Etch Rate Enhancement by Traces of Metal", J. Vac. Sci. Technol. A, Vac. Surf. Films, vol. 17, No. 3, (May/Jun. 1999), pp. 755–762 (abstract only).

Sugano et al., "Study on XeF2 Pulse Etching Using Wagon Wheel Pattern", Proceedings of the 1999 International Symposium on Micromechantronics and Human Science: Towards the New Century, Nagoya, Japan (Nov. 23–26, 1999), pp. 163–167 (abstract only).

Wang et al., "Gas–Phase Silicon Etching with Bromine Trifluoride", International Solid State Sensors and Actuators Conference (Transducers '97), Chicago, IL, vol. 2 (Jun. 16–19, 1997), pp. 1505–1508 (abstract only).

Muthukumaran et al., "Gas–Phase Xenon Difluoride Etching of Microsystems Fabricated Through the Mitel 1.5–mu m CMOS Process", Can. J. Electr. Comput. Eng. (Canada), vol. 25, No. 1 (Jan. 2000), pp. 35–41 (abstract only).

Toda et al., "Thin Beam Bulk Micromachining Based on RIE and Xenon Difluoride Silicon Etching", International Solid State Sensors and Actuators Conference (Transducers '97), Chicago, IL, vol. 1 (Jun. 16–19, 1997), pp. 671–674.

Sebel et al., "Etching of Si Through a Thick Condensed XeF2 Layer", J. Vac. Sci. Technol. A, Vac. Surf. Films, vol. 18, No. 5 (Sep./Oct. 2000), pp. 2090–2097 (abstract only).

* cited by examiner

BARRIER LAYERS FOR MICROELECTROMECHANICAL SYSTEMS

TECHNICAL FIELD OF THE INVENTION

The present invention is related generally to microelectromechanical systems, and, more particularly, to fabricating microelectromechanical systems using barrier layers

SUMMARY OF THE INVENTION

The present invention provides a method of fabricating microelectromechanical systems. The method precludes interaction and diffusion of sacrificial layers with structure layers of microelectromechanical systems by depositing selected barrier materials between structure and sacrificial layers. The barrier materials can be either removed along with the sacrificial materials during the releasing process or kept along with the structure layers of the system after releasing.

In an embodiment of the invention, a method is disclosed. The method comprises: depositing a first sacrificial layer, depositing a first barrier layer after the first sacrificial layer, forming a structural layer of a microelectromechanical device after the first barrier layer; releasing the microelectromechanical device by removing the first sacrificial layer and the first barrier layer; and wherein the first barrier layer prevents diffusion and reaction between the first sacrificial layer and the structural layer.

As a feature of the embodiment, the method further comprises: before releasing the microelectromechanical device by removing the first sacrificial layer and the first barrier layer, depositing a second barrier layer after the structural layer formed on the first barrier layer; depositing a second sacrificial layer after the second barrier layer; forming one or more structure layers of the microelectromechanical device after the second sacrificial layer; and wherein the second barrier layer prevents diffusion and interaction between the second sacrificial layer and the structural layer formed underneath the second barrier layer; and wherein the step of releasing the microelectromechanical device by removing the first sacrificial layer and the first barrier layer further comprises: removing the second sacrificial layer and the second barrier layer.

As another feature of the embodiment, the method further comprises: before releasing the microelectromechanical device by removing the first sacrificial layer and the first barrier layer, depositing a second barrier layer after the structural layer formed on the first barrier layer; depositing a second sacrificial layer after the second barrier layer; forming one or more structural layers of the microelectromechanical device after the second sacrificial layer; and wherein the second barrier layer prevents diffusion and interaction between the second sacrificial layer and the structure layer formed underneath the second barrier layer; and wherein the step of releasing the microelectromechanical device by removing the first sacrificial layer and the first barrier layer further comprises: removing the second sacrificial layer, and wherein the second barrier layer is not removed after releasing the microelectromechanical device.

In another embodiment of the invention, a method is disclosed herein. The method comprises: depositing a first sacrificial layer; depositing a first barrier layer after the first sacrificial layer; patterning the first barrier layer, forming a structural layer of a microelectromechanical device after the patterned first barrier layer, releasing the microelectromechanical device by removing the first sacrificial layer; and wherein the first barrier layer prevents diffusion and reaction between the first sacrificial layer and the structural layer, and the first barrier layer is not removed after releasing the microelectromechanical device.

As a feature of the embodiment, the method of said embodiment of the invention further comprises: before releasing the microelectromechanical device by removing the first sacrificial layer, depositing a second barrier layer after the structural layer formed on the first barrier layer; depositing a second sacrificial layer after the second barrier layer; forming one or more structure layers of the microelectromechanical device after the second sacrificial layer; and wherein the second barrier layer prevents diffusion and interaction between the second sacrificial layer and the structural layer formed underneath the second barrier layer; and wherein the step of releasing the microelectromechanical device by removing the first sacrificial layer further comprises: removing the second sacrificial layer and the second barrier layer.

As another feature of the embodiment, the method of said embodiment of the invention further comprises: before releasing the microelectromechanical device by removing the first sacrificial layer, depositing a second barrier layer after the structural layer formed on the first barrier layer; depositing a second sacrificial layer after the second barrier layer; forming one or more structural layers of the microelectromechanical device after the second sacrificial layer; and wherein the second barrier layer prevents diffusion and interaction between the second sacrificial layer and the structure layer formed underneath the second barrier layer; and wherein the step of releasing the microelectromechanical device by removing the first sacrificial layer further comprises: removing the second sacrificial layer; and wherein the second barrier layer is not removed after releasing the microelectromechanical device.

In further embodiment of the invention, a method is disclosed herein. The method comprises: providing a substrate, on which a first sacrificial layer with a target thickness can be deposited; depositing the first sacrificial layer at a thickness less than the target thickness; measuring a thickness of the deposited first sacrificial layer; and depositing a second sacrificial layer with a thickness substantially equal to the difference between the target thickness and the measured thickness of the deposited first sacrificial layer.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

FIG. 10b presents an exemplary micromirror array comprising a plurality of micromirrors of FIG. 10a;

FIG. 11b is a back-view of a micromirror array comprising a plurality of micromirrors of FIG. 11a;

DETAILED DESCRIPTION OF THE EMBODIMENTS

The present invention provides a barrier layer that comprises selected barrier material(s) between a structure layer of the microelectromechanical device and a sacrificial layer during fabrication process. The barrier layer prevents diffusion and interaction between the sacrificial layer and the structure layer. The material for the barrier layer is selected depending upon detailed fabrication process. Specifically, the barrier material can be selected such that the barrier layer is removed with the sacrificial layer after releasing the microelectromechanical device. Alternatively, the barrier material can be such one that the barrier layer is not removed with the sacrificial layer after releasing.

As a feature of the embodiment, a barrier layer is deposited on a deposited sacrificial layer for compensating the deposition thickness inaccuracy of the deposited sacrificial layer.

Figure 1:
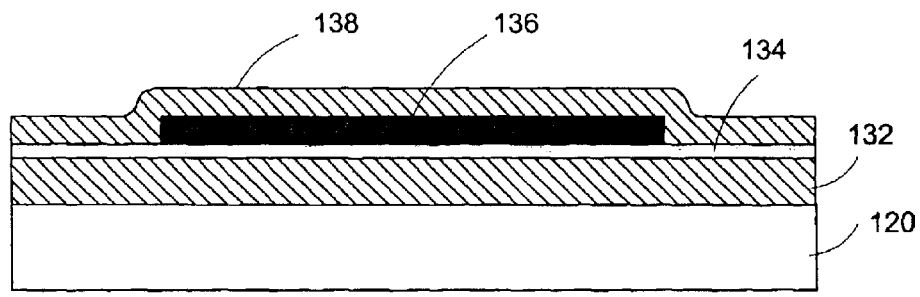
FIG. 1 is a cross-sectional view of a structure illustrating a barrier layer formed between a structural layer of a microelectromechanical device and a sacrificial layer according to an embodiment of the invention.

In an embodiment of the invention, a barrier layer is deposited between a sacrificial layer and a structure layer of a microelectromechanical device, as shown in FIG. 1. Referring to FIG. 1, layer 132 is a sacrificial layer deposited on substrate 120 for building desired structures of a microelectromechanical (MEMS) device during a fabrication process, and layer 136 is a structure layer of the device. If the structure layer 136 is directly deposited on the sacrificial layer 132, the material of the structural layer may sometimes diffuse into the sacrificial layer and/or interact with the material of the sacrificial layer, or vice versa. Such diffusion and interaction can deteriorate desired properties of the structure layer and expected performances of the MEMS device. In order to prevent such diffusion and interaction, barrier layer 134 is provide between the sacrificial layer and the structure layer. Preferably, the barrier layer is deposited on the sacrificial layer, and the structure layer is deposited on the barrier layer, as shown in the figure. In the preferred embodiment of the invention, the barrier layer comprises one or more barrier materials that are different from the sacrificial layer 132.

A preferred barrier layer is a layer that, in addition to preventing diffusion and interaction between the sacrificial and structure layers, there is substantially no diffusion and interaction between the two layers (e.g. the barrier layer and the given structure layer). By "no diffusion between two layers", it is meant that no material from a first layer diffuses into a second layer, and no material from the second layer diffuses into the first layer. Moreover, the ideal barrier layer is a layer that substantially has no interaction and diffusion between the barrier layer and the sacrificial layer. Otherwise, the residue(s) of the interaction or diffusion of between the barrier layer and the sacrificial layer may not be removable with the sacrificial layer. Such ideal materials, however, may not be promptly available for many currently used structure materials, such as aluminum, especially when the non-diffusion and non-interaction property requirements is to be balanced with other requirements on, for example, electrical and/or mechanical properties of the barrier layer. Other materials that neither diffuse into nor interact with the structure layer during a certain time period (e.g. time elapsed from the deposition of the structural layer and to the removal of the sacrificial layer) under a certain temperature (e.g. highest temperature during the fabrication time period) are also preferred because the deterioration resulting from the diffusion and interaction may only happen during the fabrication process and above certain processing temperatures. Furthermore, it is preferred that there is substantially no interaction or diffusion between the barrier layer and the sacrificial layer within the certain time period and under the certain temperature. Alternatively, another layer that is different from the sacrificial layer and the barrier layer (not shown) can be deposited between the barrier layer and the sacrificial layer. After structure layer 136, another sacrificial layer 138 may be deposited for forming other structure layers of the MEMS device. According to the embodiment, barrier layer 134 is removed with the sacrificial layers. It is worthwhile to point out that barrier layer can be removed along with the sacrificial layer using one etching step. In this case, the barrier material for the barrier layer is removable in the etching process (and the etchant) that is selected for removing the sacrificial layer. Alternatively, the barrier layer and the sacrificial layer can be removed using separate etching steps, but not necessarily in this order.

Figure 2A:
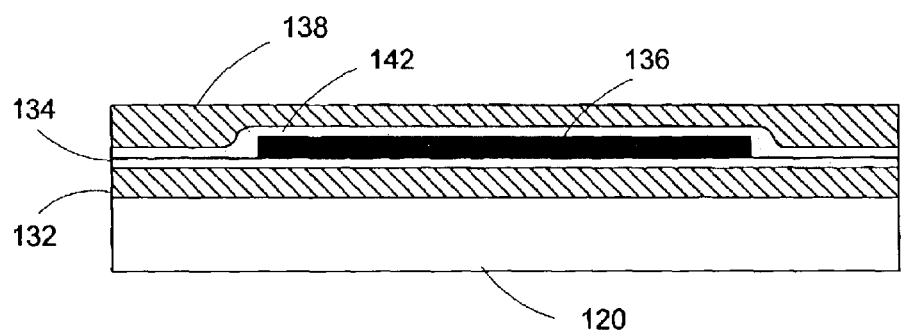
FIG. 2a is a cross-sectional view of a structure illustrating a barrier layer formed between a structural layer of a microclectromechanical device and a sacrificial layer according to another embodiment of the invention.

As an aspect of the embodiment, a second barrier layer 142 is deposited after structure layer 136, as shown in FIG. 2a. Preferably, the second barrier layer is deposited on the structure layer and covers the structure layer, including the vertical edges of the structure layer. By doing so, possibilities of diffusion and interaction between the edges of the structure layer and the sacrificial layer are eliminated. It is further preferred that the second barrier layer is provided when the second sacrificial layer needs to be deposited. Second barrier layer 142 can be used without second sacrificial layer 138, such as when there is a time period lag between depositing the layers and later (e.g. at a different location), releasing the MEMS device. In this case, these layers act as a protecting film in the interim. Similar to layer 134, the second barrier layer prevents diffusion and interaction between structure layer 136 and the second sacrificial layer 138, if present. Layer 142 is preferably a layer that there is substantially no diffusion and interaction, or substantially no diffusion and interaction within a certain time period (e.g. fabrication duration) and under a certain temperature (e.g. the highest temperature during fabrication) between structure layer 136 and barrier layer 142. In the aspect of the invention, the second barrier layer 142 is removed with sacrificial layers 132 and 138. Similar to barrier layer 134, barrier layer 142 can be removed along with the sacrificial layers using one etching step. Alternatively, the second barrier layer can be removed by a separate etching step from that for sacrificial layers.

Figure 2B:
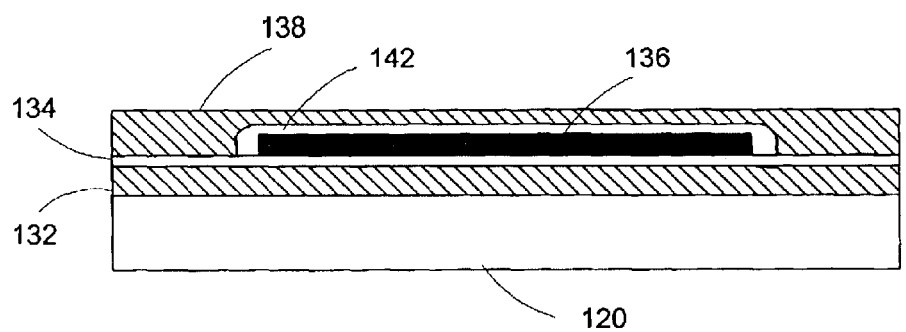
FIG. 2b is a cross-sectional view of a structure illustrating a barrier layer formed between a structural layer of a microelectromechanical device and a sacrificial layer according to yet another embodiment of the invention.

In another embodiment of the invention, different from the removable first barrier layer 134, the second barrier layer 142 is not removed after releasing, as shown in FIG. 2b. Specifically, the second sacrificial layer 142 may be patterned according to the structure layer and remains with structure layer 136 after releasing. Particularly, the patterned barrier layer covers, in addition to the surfaces of the structure layer, the vertical edges of the structure layer. In this case, the second barrier layer comprises a different barrier material from that of the first barrier layer. And the barrier material for the second barrier layer is not removable using the etching method(s) selected for removing the sacrificial layers and the first barrier layer, either in one etching step or in separate etching steps.

Figure 3:
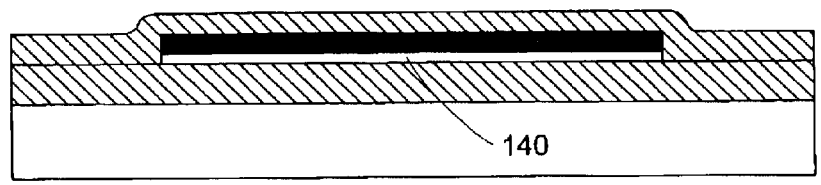
FIG. 3 is a cross-sectional view of a structure illustrating a barrier layer formed between a structural layer of a microelectromechanical device and a sacrificial layer according to a further embodiment of the invention.

According to yet another embodiment of the invention, a first barrier layer 140 is deposited between the structure layer and the first sacrificial layer for preventing the diffusion and interaction between the first sacrificial layer 132 and structure layer 136, as shown in FIG. 3. Referring to FIG. 3, similar to barrier layer 134, barrier layer 140 neither interacts with nor diffuses into structure layer 136, or barrier layer 140 neither interacts with nor diffuses into structure layer 136 within a certain time period (e.g. fabrication duration) and under a certain temperature (e.g. the highest temperature in fabrication process). Unlike the first barrier layer 134 in FIG. 1, the first barrier layer 140 is not removed after releasing the microelectromechanical device by removing the sacrificial layers. Instead, the first barrier layer 140 is patterned after its deposition according to the structure layer formed thereon afterwards and remains after the releasing. In this case, the material of the first barrier layer 140 is not removable using the etching method selected for removing the sacrificial layer 132. After the formation of structure layer 136, a second sacrificial layer 138 may be deposited as appropriate for forming other structure layers of the microelectromechanical device.

Figure 4A:
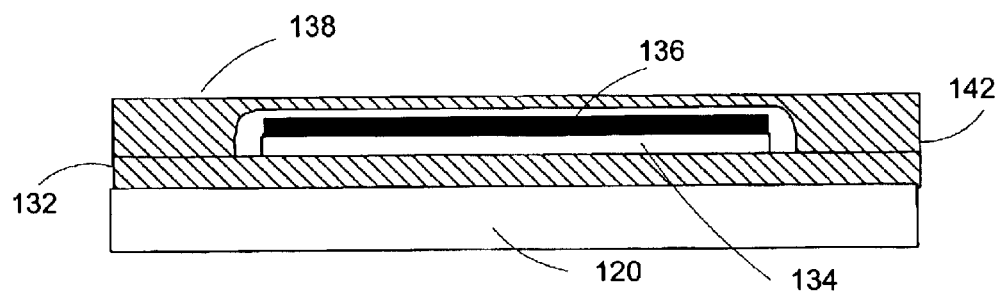
FIG. 4a is a cross-sectional view of a structure illustrating two barrier layers formed between a structural layer of a microelectromechanical device and two sacrificial layers according to yet another embodiment of the invention.

As an aspect of the embodiment, a second barrier layer 142 may be deposited on the formed structure layer 136, as shown in FIG. 4a. The second barrier layer 136 is provided for preventing the diffusion and interaction between structure layer 136 and the second sacrificial layer 138. It is preferred that the second barrier 142 neither interacts with nor diffuses into structure layer 136, or neither interacts with not diffuses into structure layer 136 within a certain time period (e.g. fabrication duration) and under a certain temperature (e.g. the highest temperature in the fabrication process). The same as the first barrier layer 134, the second barrier layer 142 is patterned according to structure layer 136 and remains after the releasing. That is, the barrier material of the second barrier layer is not removable using the etching method (including the etchant) selected for removing the sacrificial layers (132 and 138). Preferably, the patterned barrier layer also covers, in addition to the surfaces of the structure layer, the vertical edges of the structure layer. Of course, the barrier material of the second barrier layer 142 is not necessarily the same as that of the first barrier layer 134.

Figure 4B:
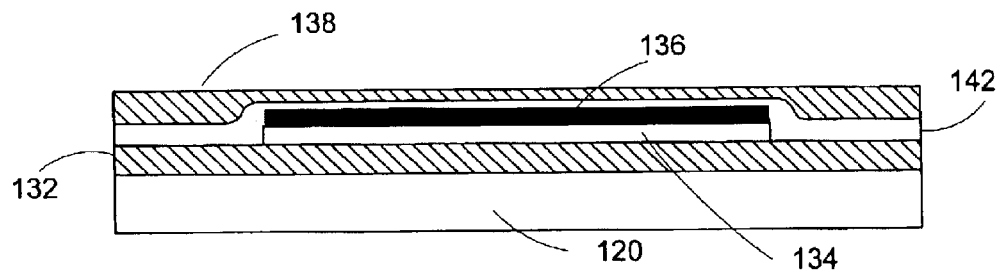
FIG. 4b is a cross-sectional view of a structure illustrating two barrier layers formed between a structural layer of a microelectromechanical device and two sacrificial layers according to still yet another embodiment of the invention.

According to a further embodiment of the invention, the second barrier layer 142 is removed along with the sacrificial layers after releasing, as shown in FIG. 4b. Specifically, the second barrier layer is deposited on the structure layer. The deposited second barrier layer covers, in addition to the surfaces of the structure layer, the vertical edges of the structure layer. The second barrier layer is preferably a material that neither interacts with not diffuses into structure layer 136, or neither interacts with not diffuses into structure layer 136 within a certain time period (e.g. fabrication duration) and under a certain temperature (e.g. the highest temperature in the fabrication process), but it is removable using the etching method (including the etchant) selected for removing the sacrificial layers. Alternatively, the second barrier layer can be removed at a separate etching step than that for the sacrificial layers. The samples above where two sacrificial layers are deposited can be where a micromirror plate 136 is on one sacrificial layer, and hinges are formed on the second sacrificial layer, such as will be described in reference to FIG. 8a and FIG. 8b.

Figure 5:
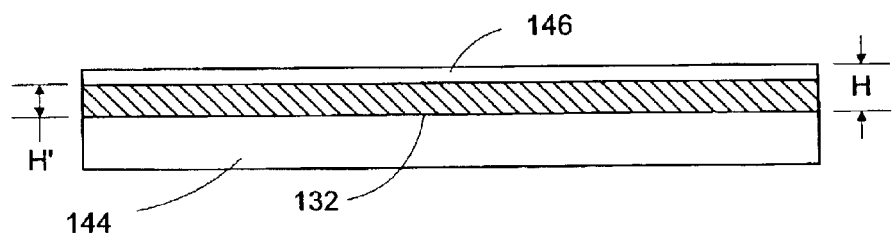
FIG. 5 is a cross-sectional view of a structural illustrating a barrier layer deposited on a sacrificial layer for compensating the decrease of the sacrificial layer after deposition.

Alternatively, a barrier layer can be applied to compensate the deposition thickness inaccuracy of a deposited sacrificial layer. Referring to FIG. 5, sacrificial layer 132 with a total target thickness, represented by H, is desired on substrate 144 during a fabrication process for a microelectromechanical device (not shown). After deposition, the thickness of the deposited sacrificial layer is H', which is smaller than the target thickness H (H'<H). This deposited thickness can be lower for many reasons. For example, it can be deliberately lower. It can also be lower due to process variations. In order to compensate this reduced thickness, barrier layer 146 is deposited on the sacrificial layer after measuring the thickness of the deposited sacrificial layer. Barrier layer 146 can be removed with layer 132 or separately from layer 132.

As an exemplary implementation of the embodiments of the present invention, a fabrication process for a micromirror device used in display systems will be discussed in the following. It will be understood by those skills in the art that the following discussion of the fabrication process is for demonstration purposely. It should not by any means be interpreted as a limitation. Instead, other suitable fabrication processes, such as those set forth in U.S. Pat. Nos. 5,835,256 and 6,046,840 both to Huibers, and U.S. patent application Ser. No. 10/366,297 filed on Feb. 12, 2003 to Patel, the subject matter of each being incorporated herein by reference, are also applicable. U.S patent applications Ser. Nos. 09/910,537 filed Jul. 20, 2001, and 06/300,533 filed Jun. 22, 2001 both to Reid contain examples of materials that may be used for the various components of the current invention. These applications are incorporated herein by reference.

Figure 6:
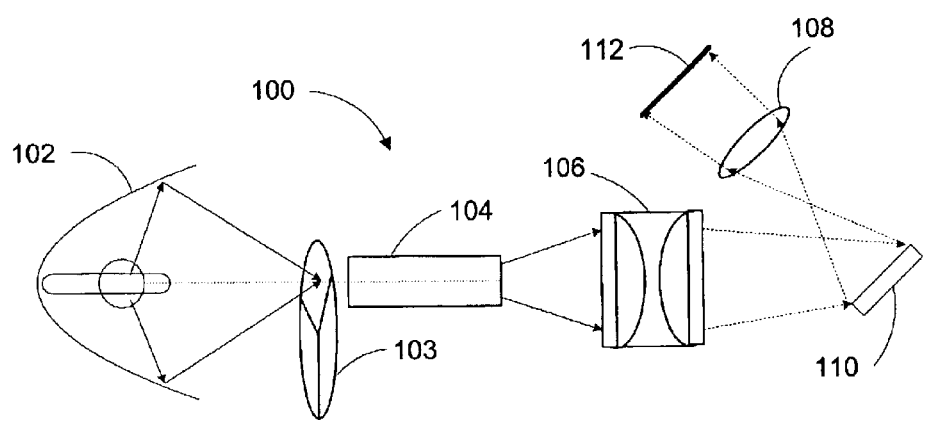
FIG. 6 is diagram illustrating an exemplary display system employing a spatial light modulator.

Referring to FIG. 6, a typical display system employing a spatial light modulator that comprises a plurality of micromirror devices is illustrated in FIG. 1. In its very basic configuration, the display system comprises light source 102, optical devices (e.g. light pipe 104, lens 106 and 108), color wheel 103, display target 112 and spatial light modulator 110. Light source 102 (e.g. an arc lamp) directs incident light through the color wheel and optical devices (e.g. light pipe 104 and object lens 106) and shines on spatial light modulator 110. Spatial light modulator 110 selectively reflects the incident light toward optical device 108 and results in an image on display target 112. The display system can be operated in many ways, such as those set forth in U.S. Pat. No. 6,388,661, and U.S. patent application Ser. No. 10/340,162, filed on Jan. 10, 2003, both to Richards, the subject matter of each being incorporated herein by reference.

In another exemplary display system (not shown), light source 102, optical elements 104, 106 and 108, and display target 112, as shown in FIG. 6, are provided, while color wheel 103 is removed. In this display system, three spatial light modulators are provided with each spatial light modulator being designated for modulating one of the three primary colors. Specifically, incident light from the light source is split, for example by a prism, into green, blue and red light. Each light impinges one of the three spatial light modulators and is modulated. The modulated light from all three spatial light modulators are then mapped onto the display target properly for displaying color images.

Figure 7:
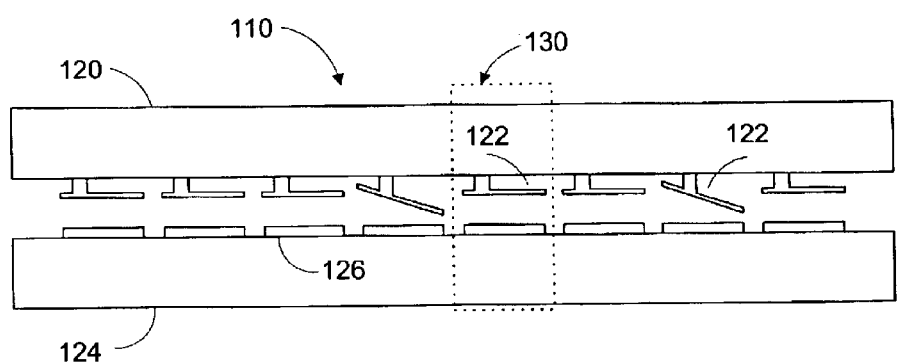
FIG. 7 is a cross-sectional view of a portion of the spatial light modulator used in the display system of FIG. 6 and a portion of an array of micro-mirrors comprised in the spatial light modulator.

In either display systems, the spatial light modulator of the system generally comprises an array of thousands or millions of micro-mirrors, a portion of a cross-sectional view of which is illustrated in FIG. 7. Referring to FIG. 7, an array of micromirrors (e.g. micromirrors 122) is formed on a substrate 120, such as glass that is transparent to visible light. Substrate 124, which comprises an array of electrodes (e.g. electrode 126) and circuitry (not shown), is placed proximate to the array of micromirrors for electrostatically controlling the motion of the micromirrors. In operation, each individual micromirror can be deformed as desired under the control of one or more electrodes and circuitry; thereby the spatial modulation of the incident light traveling through substrate 120 and shining on the surfaces of the micromirrors can be achieved.

The micromirror devices, such as micromirror device 130 can be fabricated in many ways, such as those set forth in U.S. Pat. Nos. 5,835,256 and 6,046,840 both to Huibers, and U.S. patent application Ser. No. 10/366,297 filed on Feb. 12, 2003 to Patel. An exemplary fabrication method according to embodiments of the present invention will be discussed in the following with references to FIG. 8a through FIG. 9.

Figure 8A:
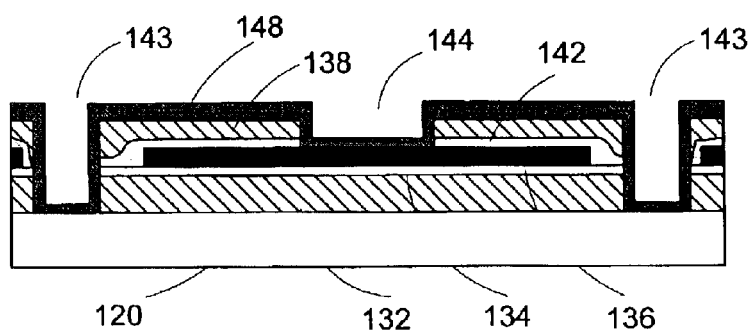
FIG. 8a is a cross-sectional views of a micromirror device of FIG. 7 before patterning the hinge layers during an exemplary fabrication process.
Figure 9:
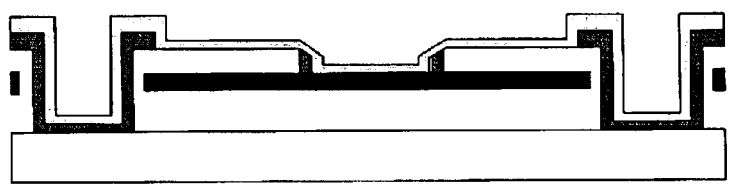
FIG. 9 is the cross-sectional view of FIG. 8b after removing the sacrificial and barrier layers.

Referring to FIG. 8a, substrate 120 is provided. First sacrificial layer 132 is deposited on the substrate followed by a deposition of a first barrier layer 134, on which micromirror plate layer 136 is deposited thereafter. The substrate can be a glass (e.g. 1737F, Eagle 2000), quartz, Pyrex™, sapphire etc. The substrate may also be a semiconductor substrate (e.g. silicon substrate) with one or more actuation electrodes and/or control circuitry (e.g. CMOS type DRAM) formed thereon. First sacrificial layer 132 may be any suitable material, such as amorphous silicon, depending upon the structural materials selected to be resistant to the etchant, and the etchant selected. If the first sacrificial layer is amorphous silicon, it can be deposited at 300–350° C. The thickness of the first sacrificial layer can be wide ranging depending upon the micromirror size and desired titled angle of the micromirror plate, though a thickness of from 500 Å to 50,000 Å, preferably around 10,000 Å, is preferred. The first sacrificial layer may be deposited on the substrate using any suitable method, such as LPCVD or PECVD.

After depositing the first sacrificial layer, micromirror plate layer 136 for a micromirror plate is going to be deposited. Because the micromirror plate is designated for reflecting incident light in the spectrum of interest (e.g. visible light spectrum), it is preferred that the micro-mirror plate layer comprises of one or more materials that exhibit high reflectivity (preferably 90% or higher) to the incident light. Examples of such materials are Al, Ti, Ag, AlSi$_x$Cu$_y$, AlTi$_x$ or AlSi$_x$. Of course, other suitable materials having high reflectivity to the incident light of interest may also be adopted for the micro-mirror plate. The materials, such as Al, for the micromirror plate layer, however, diffuse into and/or interact with the sacrificial layer, such as an amorphous silicon layer. The diffusion and interaction certainly deteriorate the expected property of the micromirror plate and desired performance of the micromirror device. Specifically, the diffusion and interaction may create defects on the micromirror device. In order to prevent such diffusion and interaction, first barrier layer 134 that will be removed with the sacrificial layers afterwards is deposited between sacrificial layer 132 and micromirror plate layer 136. It is preferred that there is substantially no interaction or diffusion between the barrier layer and the micromirror plate, or substantially no interaction or diffusion between the barrier layer and the micromirror plate within the fabrication time period, such as 30 minutes, and under 400° C. (degree), which is the highest temperature during the fabrication time period. It is further preferred that there is substantially no interaction or diffusion between the barrier layer and the sacrificial layer, or substantially no interaction or diffusion between the barrier layer and the sacrificial layer within the certain time period and under the certain temperature. Exemplary barrier materials for the barrier layer are early transition metal elements (e.g. W, Ti, Ta and Mo), early transition metal alloys (e.g. WTi$_x$, WMo$_x$, and WTa$_x$), early transition metal compounds (e.g. WAl$_x$) including early transition metal suicides (e.g. WSi$_x$, MoSi$_x$, TiSi$_x$, ZrSi$_x$, CrSi$_x$, TaSi$_x$ and TiW$_x$Si$_y$). Other early transition metal silicide, such as CoSi$_x$, is also applicable. The early transition metals are those elements in the periodic table in columns 3 through 7, namely columns beginning with Sc, Ti, V, Cr, and Mn. Preferred are those elements in columns 4 through 6 (i.e. Ti, Zr, Hf, V, Nb, Ta, Cr, Mo and W). Of course, other suitable barrier materials that prevent the diffusion and interaction between the micromirror plate and the first sacrificial layer and are removable with the sacrificial layer are also applicable.

After the first barrier layer 134, micromirror plate layer 136 is deposited thereon for forming a micromirror plate of the micromirror device (e.g. micromirror device 130 in FIG. 7). In depositing the micro-mirror plate layer, PVD is preferably used. The thickness of the micro-mirror plate layer can be wide ranging depending upon many factors, such as desired mechanical (e.g. stiffness and strength) and electronic (e.g. conductivity) properties, the size, desired rotation angle of the micro-mirror plate and the properties of the materials selected for the micromirror plate. According to the invention, a thickness of from 500 Å to 50,000 Å, preferably around 2500 Å, is preferred. If the micromirror plate layer comprises aluminum, it is preferred to be deposited at 150° C. to 300° C. or other temperatures preferably less than 400° C.

Figure 10A:
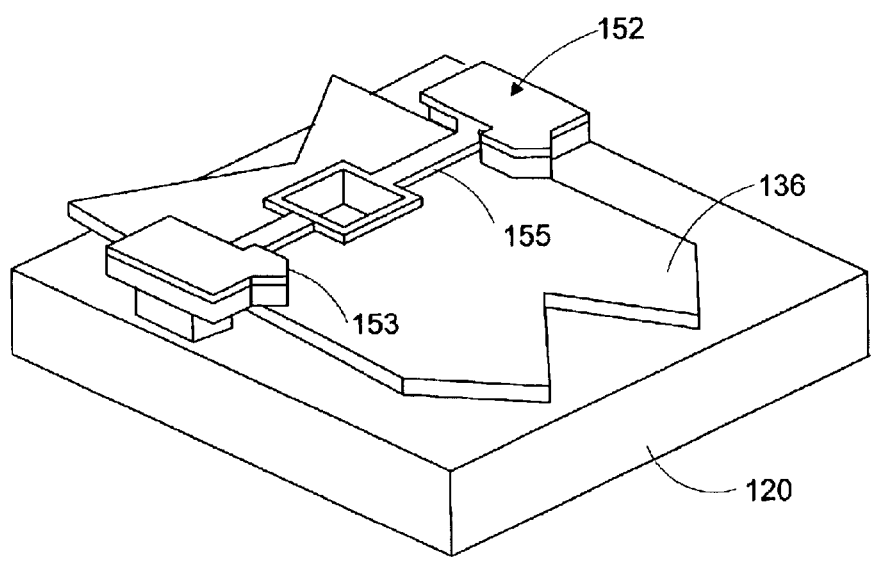
FIG. 10a shows an exemplary micromirror device after releasing.

Micromirror plate layer 136 is then patterned into a desired shape, an example of which is illustrated in FIG. 10a. Though preferred, it would be appreciated by those ordinary skilled in the arts that this particular example of micromirror shape is a selection from a variety of optional choices of mirror shapes and is for demonstration purpose only. It should not be interpreted as a limitation. Instead, the micro-mirror plate can be of any desired shape. The patterning of the micro-mirror plate can be achieved using the standard photoresist patterning followed by etching using, for example $CF_4$, $Cl_2$, or other suitable etchant depending upon the specific material of the micromirror plate.

After the formation of the micro-mirror plate, second barrier layer 142 is deposited followed by deposition of second sacrificial layer 138 for forming other structures, such as hinge 152 in FIG. 10a, of the micromirror device. Similar to the first barrier layer 134, the second barrier layer 142 is deposited for preventing diffusion and interaction between micromirror plate 136 and second sacrificial layer 138, and it will be removed along with the sacrificial layers afterwards. The same as first barrier layer 134, second barrier layer is preferably is layer that neither interact with nor diffuses into micromirror plate 136. Exemplary barrier materials for the second barrier layer can be the same as those in reference to first barrier layer 134. Though preferably the same, the material for the second barrier layer may not be the same as that for the first barrier layer.

After the second barrier layer, second sacrificial layer 138 is deposited and patterned according to the desired configuration of the hinge structure. Second sacrificial layer 138 may comprise amorphous silicon, or could alternatively comprise one or more of the various materials mentioned above in reference to first sacrificial layer 132. First and second sacrificial layers need not be the same, though are the same in the preferred embodiment such that the etching process for removing these sacrificial layers can be greatly simplified. Similar to the first sacrificial layer, second sacrificial layer 138 may be deposited using any suitable method, such as LPCVD or PECVD. If the second sacrificial layer comprises amorphous silicon, the layer can be deposited around 350° C. The thickness of the second sacrificial layer can be on the order of 10000 Å, but may be adjusted to any reasonable thickness, such as between 2000 Å and 20,000 Å depending upon the desired distance (in the direction perpendicular to the micromirror plate and the substrate) between the micromirror plate and the hinge. Second sacrificial layer 138 may also fill in the trenches left from the patterning of the micromirror plate.

The deposited sacrificial layers and barrier layers are then patterned for forming two deep-via areas 143 and shallow via area 144 using standard lithography technique followed by etching. The etching step may be performed using $Cl_2$, $BCl_3$, or other suitable etchant depending upon the specific material(s) of the second sacrificial layer. The distance across the two deep-via areas 150 depends upon the side-to-side distance of the micro-mirror plate. In an embodiment of the invention, the distance across the two deep-via areas after the patterning is preferably around 10 μm, but can be any suitable distance as desired. In order to form shallow-via area 144, an etching step using $CF_4$ or other suitable etchant may be executed. The shallow-via area, which can be of any suitable size, is preferably on the order of 2.2 μm.

In order to form the desired deep-via area 143 profiles as shown, a via-mask and partial sacrificial layer etching are applied. According to an embodiment of the invention, the wider region of each deep-via area 143 is on the order of 1.0 to 2.0 um, preferably 1.4 um, and the smaller region is on the order of 0.5 to 1.5 um, preferably 1.0 um. Of course, other dimensions are possible depending upon the final size and shape of the micro-mirror plate. Alternatively, the deep-via areas may reach through first sacrificial layer 132 and may reach from 500 Å to 2000 Å into substrate 120. As discussed above, the deep-via areas are formed in two etching steps. By doing so, the effect of resist erosion may be reduced, and step coverage of $SiN_x$ in the subsequent deep-via fill deposition may be improved. However, a single etching step can also be used.

After patterning the sacrificial and barrier layers, one or more hinge structure layers (e.g. 148) are deposited for forming a hinge support. During the deposition, layer 148 fills the formed deep-via areas and shallow-via area. Because the hinge structure layer is designated to form the posts (e.g. 153 in FIG. 10a) for holding the hinge (e.g. 253 in FIG. 10a) and the micromirror plate (e.g. 136 in FIG. 10a) attached thereto such that the micromirror plate can rotate relative to the substrate by the hinge, it is desired that the hinge structure layer comprise materials having a sufficiently large elastic modulus. According to an embodiment of the invention, layer 148 comprises a 300 Å thickness of $TiN_x$ layer deposited by PVD, and a 3500 Å thickness of $SiN_x$ layer deposited by PECVD. Of course, other suitable methods of deposition may be used, such as LPCVD or sputtering. Of course, other suitable materials, such as $CoSiN_x$, $TiSiN_x$ and/or $TiO_x$ may also be used for the hinge structure.

After the deposition, the hinge structure layer is patterned for forming two posts 150 and contact (not shown) by etching using one or more proper etchants. In particular, the layers can be etched with a chlorine chemistry or a fluorine chemistry where the etchant is a perfluorocarbon or hydrofluorocarbon (or $SF_6$) that is energized so as to selectively etch the hinge layers both chemically and physically (e.g. a plasma/RIE etch with $CF_4$, $CHF_3$, $C_3F_8$, $CH_2F_2$, $C_2F_6$, $SF_6$, etc. or more likely combinations of the above additional gases, such as $CF_4/H_2$, $SF_6/Cl_2$, or gases using more than one etching species such as $CF_2Cl_2$, all possibly with one or more optional inert diluents). Different etchants may, of course, be employed for etching each hinge layer (e.g. chlorine chemistry for a metal layer, hydrocarbon or fluorocarbon (or $SF_6$) plasma for silicon or silicon compound layers, etc.).

Figure 8B:
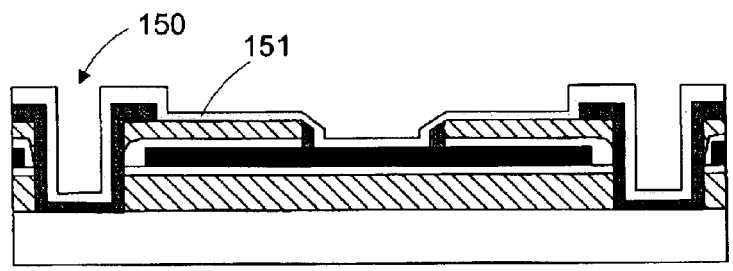
FIG. 8b is a cross-sectional view of FIG. 8a after patterning the hinge layers.

After the patterning of the hinge structure layer, hinge layer 151 is deposited and then patterned as shown in FIG. 8b. Because the hinge deforms with the micromirror plate rotating, it is expected that the hinge is more compliant. Furthermore, when the hinge is also used as electric conducting media for the micro-mirror plate, it is further expected that the hinge is electrically conductive. Examples of suitable materials for the hinge layer are silicon nitride, silicon carbide, polysilicon, Al, Ir, titanium, titanium nitride, titanium oxide(s), titanium carbide, $CoSi_xN_y$, $TiSi_xN_y$, $TaSi_xN_y$, or other ternary and higher compounds. When titanium is selected for the hinge layer, it can be deposited at 100° C. to 400° C. Other ternary compositions, such as set forth in U.S. patent applications Ser. Nos. 09/910,537 to Reid filed Jul. 20, 2001 and 10/198,389 to Reid, filed Jul. 16, 2002, each incorporated herein by reference, are also applicable. Alternatively, the hinge can be a multilayered structure, such as those disclosed in U.S. patent application Ser. No. 10/366,297 filed on Feb. 12, 2003 to Patel, the subject matter of which being incorporated herein by reference.

After deposition, the hinge layer is patterned and etched. Similar to the hinge structure layer (layer 148), the hinge layer can be etched with a chlorine chemistry or a fluorine chemistry where the etchant is a perfluorocarbon or hydrofluorocarbon (or $SF_6$) that is energized so as to selectively etch the hinge layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Different etchants may, of course, be employed for etching the hinge layer (e.g. chlorine chemistry for a metal layer, hydrocarbon or fluorocarbon (or $SF_6$) plasma for silicon or silicon compound layers, etc.).

Finally, the sacrificial layers (132 and 138) and the barrier layers (134 and 142) are removed using etching so as to release micromirror device 130, which will be discussed as afterwards.

The above exemplary fabrication process is illustrated with reference to the two barrier layers being removable with the sacrificial layers after releasing. According to another embodiment of the invention, first barrier layer 136 is removable after releasing, while second barrier layer 142 is non-removable after releasing. In this case, the second barrier layer is patterned according to the micromirror plate after its deposition and before depositing second sacrificial layer 138. As a result, the patterned second barrier layer remains after releasing the micromirror device. This remained patterned barrier layer can be used for protecting the micromirror plate in operation. Because unlike the removable first barrier layer 134, the second barrier layer is not removable after releasing, it comprises different barrier material(s) from the first barrier layer. Exemplary barrier materials for the second barrier layer are inter-metallic metal compounds, early transition metal nitrides (e.g. $WN_x$, $TiN_x$, $TaN_x$, and $AlTi_xN_y$), early transition metal oxides, early transition metal oxynitrides (e.g. $TaO_xN_y$ and $TiO_xN_y$), and early transition metal carbides. Alternatively, the barrier layer can be an early transition metal silicon nitride, such as $WSi_xN_y$, $TiSi_xN_y$ or $TaSi_xN_y$. Other suitable materials, such as those materials for the structures (comprising, the micromirror plate, the hinge and the hinge structure) of the micromirror device, are also applicable for the non-removable barrier layer.

According to yet another embodiment of the invention, the first barrier layer (e.g. layer 134) is non-removable, while the second barrier layer (e.g. layer 142) is removable with the sacrificial layers after releasing. In this case, first barrier layer 134 is patterned along with the structure layer 136 or before depositing micromirror plate layer 136. Exemplary barrier materials for the first barrier layer are inter-metallic metal compounds, early transition metal nitrides (e.g. $WN_x$, $TiN_x$, $TaN_x$ and $AlTi_xN_y$), early transition metal oxides, early transition metal oxynitrides, and early transition metal carbides. Alternatively, the barrier layer can be an early transition metal silicon nitride, such as $WSi_xN_y$, $TiSi_xN_y$ or $TaSi_xN_y$. And exemplary barrier materials for the second barrier layer are early transition metal elements (e.g. W, Ti, Ta and Mo), early transition metal alloys (e.g. WTi, WTa, WMo and MoTi), early transition metal compounds, early transition metal silicides (e.g. $WSi_x$, $MoSi_x$, $TiSi_x$, $ZrSi_x$, $CrSi_x$, $TaSi_x$ and $TiW_xSi_y$), early transition metal oxides and proper early transition metal oxynitrides. Other suitable materials, such as those materials for the structures (e.g. the hinge and the hinge structure) of the micromirror device, are also applicable for the non-removable barrier layer.

According to a further embodiment of the invention, both the first and second barrier layers are not removable after releasing. In this case, first barrier layer 134 is patterned preferably along with structure layer 136 or before depositing micromirror plate layer 136. And second barrier layer 142 is patterned preferably according to the structure of the micromirror plate (e.g. 136) after its deposition and before depositing second sacrificial layer 138. Exemplary barrier materials for both first and second barrier layers are inter-metallic metal compounds, early transition metal nitrides (e.g. $WN_x$, $TiN_x$, $TaN_x$ and $AlTi_xN_y$), early transition metal oxides, early transition metal oxynitrides, early transition metal carbides and early transition metal silicon nitrides.

Figure 10B:
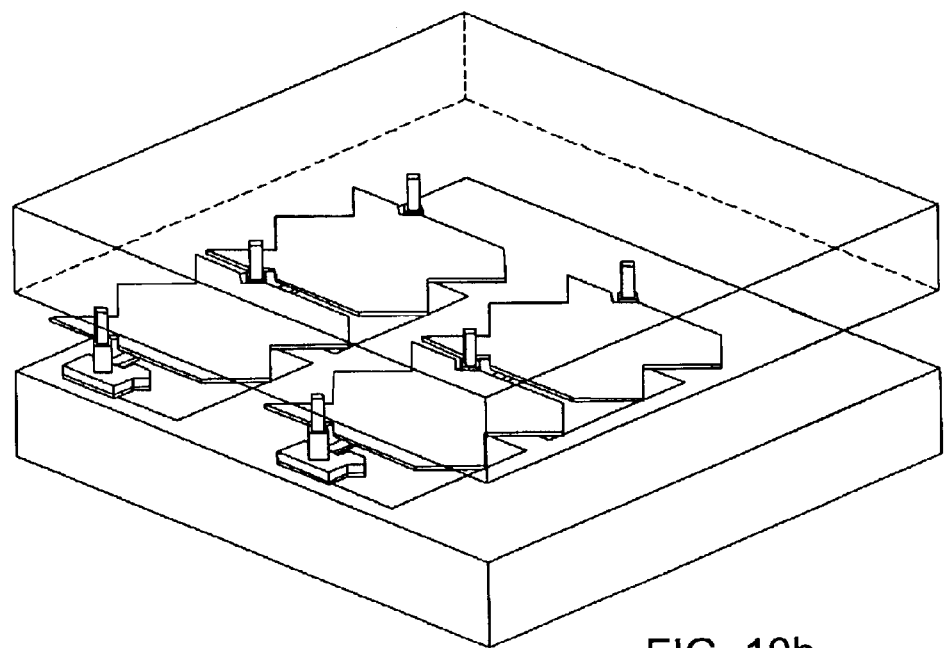
Figure 11A:
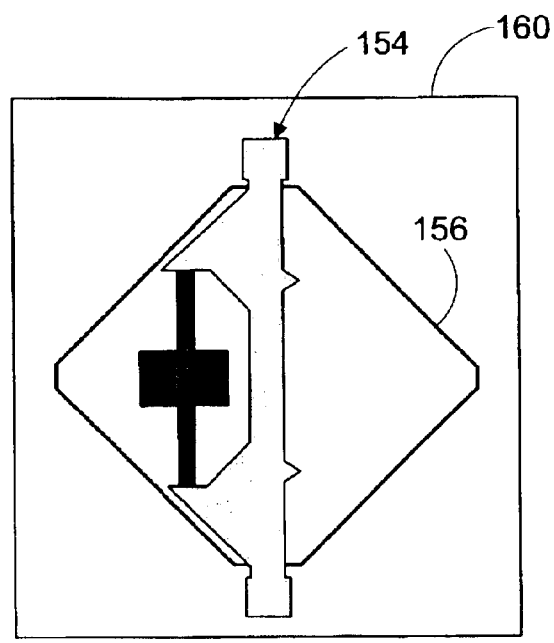
FIG. 11a is a back-view of another exemplary micromirror device after releasing.
Figure 11B:
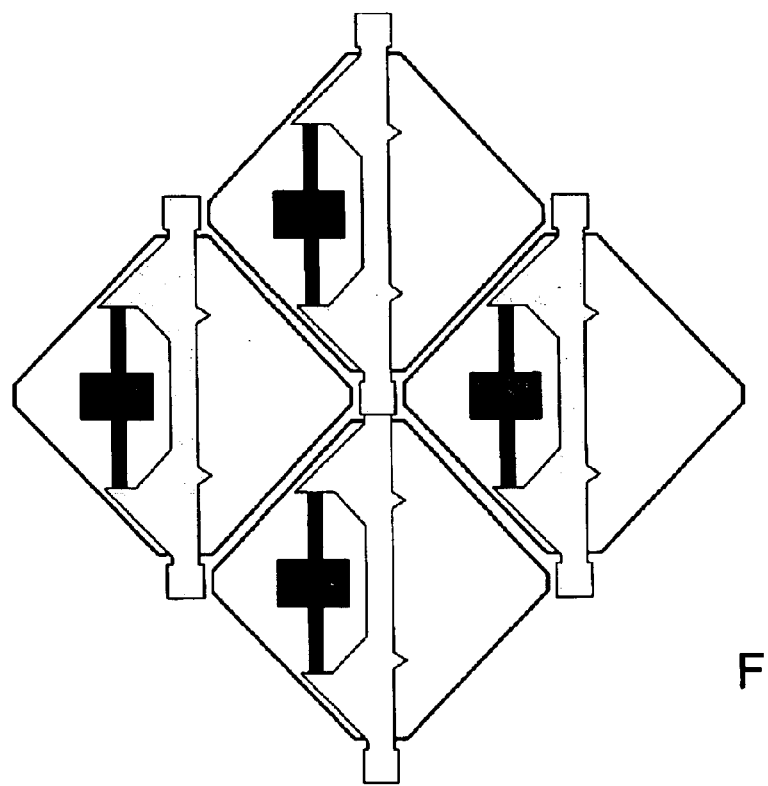

The method of the present invention can be applied in fabricating a variety of micromirror devices, one of which is shown in FIG. 10a. Other micromirror devices, such as the micromirror device in FIG. 11a, can also be fabricated using the method disclosed in the presented invention. As seen in FIG. 11a, micromirror device 160 comprises hinge structure 154 and micromirror plate 156, and other features such as those described in U.S. patent application Ser. No. 10/366,297 filed on Feb. 12, 2003 to Patel, the subject matter of which being incorporated herein by reference. The released micromirror devices, such as those in FIG. 10a and FIG. 11a can be used in micromirror arrays, as shown in FIG. 10b and FIG. 11b. The micromirror arrays may be employed by spatial light modulators, such as that in FIG. 7, which is used in a display system, such as shown in FIG. 6.

RELEASING PROCESS

The release etch utilizes an etchant gas capable of spontaneous chemical etching of the sacrificial material, preferably isotropic etching that chemically (and not physically) removes the sacrificial material. Such chemical etching and apparatus for performing such chemical etching are disclosed in U.S. patent application Ser. No. 09/427,841 to Patel et al. filed Oct. 26, 1999, and in U.S. patent application Ser. No. 09/649,569 to Patel at al. filed Aug. 28, 2000, the subject matter of each being incorporated herein by reference. Preferred etchants for the release etch are spontaneous chemical vapor phase fluoride etchants that, except for the optional application of temperature, are not energized. Examples include HF gas, noble gas halides such as xenon difluoride, and interhalogens such as $IF_5$, $BrCl_3$, $BrF_3$, $IF_7$ and $ClF_3$. The release etch may comprise additional gas components such as $N_2$ or an inert gas (Ar, Xe, He, etc.). In this way, the remaining sacrificial material and/or removable barrier layers are removed and the micromirror device is released. In one aspect of such an embodiment, $XeF_2$ is provided in an etching chamber with diluent (e.g. $N_2$ and He). The concentration of $XeF_2$ is preferably 8 Torr, although the concentration can be varied from 1 Torr to 30 Torr or higher. This non-plasma etch is employed for preferably 900 seconds, although the time can vary from 60 to 5000 seconds, depending on temperature, etchant concentration, pressure, quantity of sacrificial material to be removed, or other factors. The etch rate may be held constant at 18 Å/s/Torr, although the etch rate may vary from 1 Å/s/Torr to 100 Å/s/Torr. Each step of the release process can be performed at room temperature.

Figure 12:
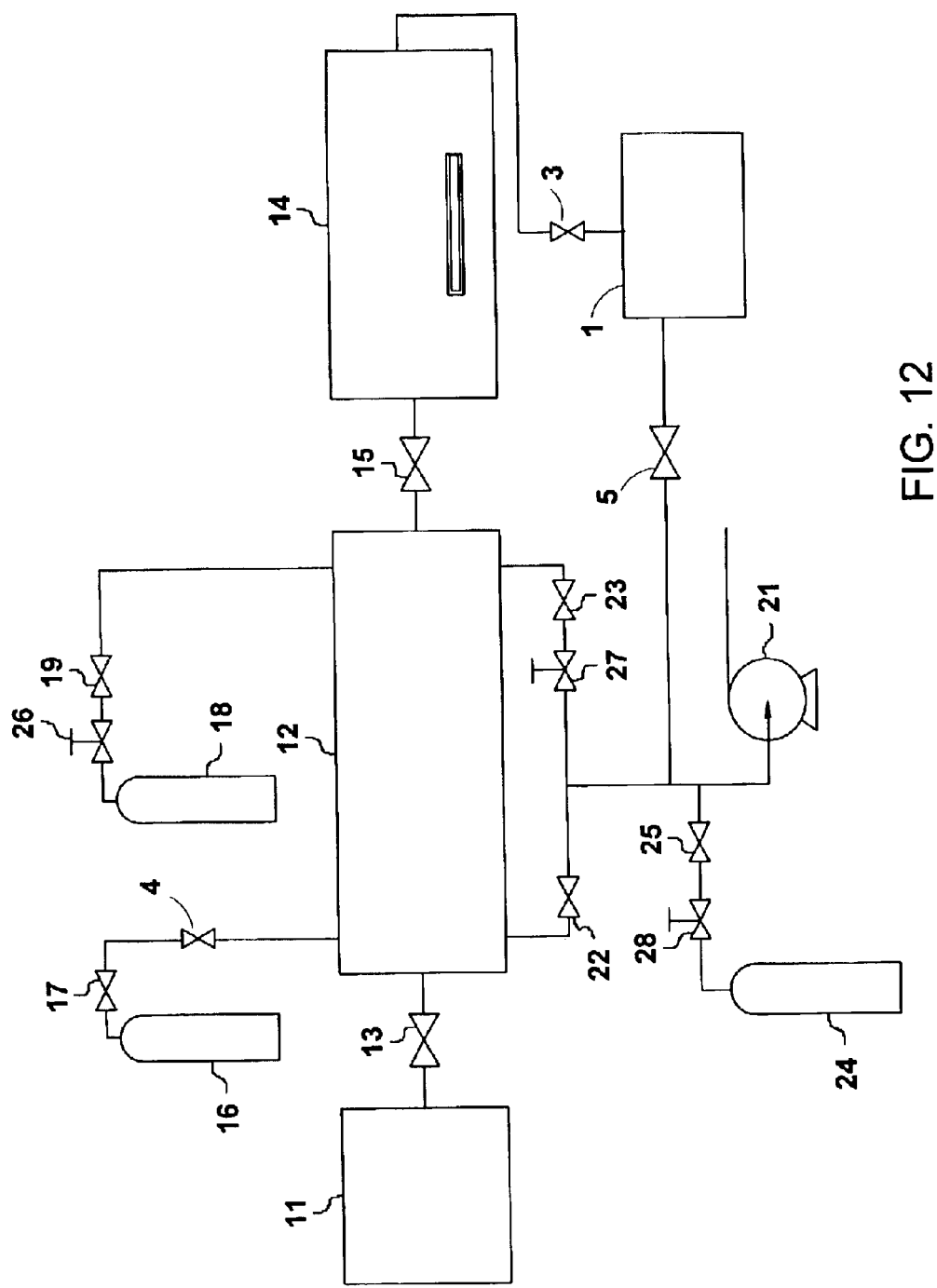
FIG. 12 is a diagram showing an exemplary etching system used in the embodiments of the invention.

In the following, exemplary etching methods and appropriate etchants are discussed with reference to FIG. 12 through FIG. 16. As can be seen in FIG. 12, an apparatus is provided for etching a sample that includes a source chamber 11 containing a source of chemical etchant, maintained at a particular temperature and pressure for maintaining the etchant source in a solid or liquid state (e.g. solid state for XeF2 crystals, liquid state for BrF3, etc.). An expansion chamber 12 is in fluid communication with source chamber 11 and has any suitable size (e.g. a volumetric capacity of 29 cubic inches (0.46 liter)) to receive etchant gas from the source chamber 11, with a shutoff valve 13 joining these two chambers. An etch chamber 14 is provided in fluid communication with expansion chamber 12 and has any suitable size (e.g. volumetric capacity of 12 cubic inches (0.18 liter)) to contain the sample microstructure to be etched. It is preferred that the etch chamber be smaller than the expansion chamber. The etch chamber 14 is connected to the expansion chamber 12 via a shutoff valve 15. Also included in the apparatus is a first gas source 16 in fluid communication with the expansion chamber 12 via a further shutoff valve 17, a second gas source 18 in fluid communication with the expansion chamber through a separate shutoff valve 19, a vacuum pump 21 and associated shutoff valves 22, 23 to control the evacuation of the chambers.

Also shown in FIG. 12 are a third gas source 24 serving as a pump ballast with an associated shutoff valve 25 to prevent backstreaming from the pump 21, and needle valves 26, 27, 28 to set the gas flow rates through the various lines and to permit fine adjustments to the pressures in the chambers. Also shown, as will be discussed in more depth below, are gas analyzer 1 and valves 3 and 5 on opposite sides of the analyzer. The expansion chamber 12 and the etch chamber 14 can both be maintained at a particular temperature, while different gases are placed in the first and second gas sources for the various etching processes. It should be noted that a single gas source could be used in place of gas sources 16 and 18.

The general procedure followed in these experiments began with the evacuation of both the expansion chamber 12 and the etch chamber 14, followed by venting both chambers to atmospheric pressure with gas from the first gas source 16 by opening the two shutoff valves 17, 15, between this gas source and the two chambers. The sample was then placed in the etch chamber 14 (with the shutoff valves 7, 15 open during the sample insertion) which was then sealed, and both the expansion chamber 12 and the etch chamber 14 were evacuated. All valves were then closed.

The connecting valve 15 between the expansion chamber 12 and the etch chamber 14 was opened, and the shutoff valve 17 at the outlet of the first gas source 16 was opened briefly to allow the gas from the first gas source to enter the expansion and etch chambers. The shutoff valve 17 is then closed. The connecting valve 15 is then closed, and the expansion chamber 12 is evacuated and isolated. The supply valve 13 from the etchant source chamber 11 is then opened to allow etchant gas to enter the expansion chamber (due to the higher temperature of the expansion chamber). The supply valve 13 is then closed, outlet valve 23 is opened, and the needle valve 27 is opened slightly to lower the etchant pressure in the expansion. Both the outlet valve 23 and the needle valve 27 are then closed. The shutoff valve 19 at the second gas source 18 is then opened and with the assistance of the needle valve 26, gas from the second gas source is bled into the expansion. At this point the expansion chamber 12 contains the etchant gas plus gas from the second gas source 18, while the etch chamber 14 contains gas from the first gas source.

With pump 21 on, the connecting valve 15 between the expansion chamber 12 and the etch chamber 14 is then opened, and valves 3 and 5 are opened on both sides of gas analyzer 1, to allow the gas mixture from the expansion chamber to enter the etch chamber and flow through the etch chamber and gas analyzer, thereby beginning the etch process. The gas analyzer 1 could also be directly connected to the etching chamber. As will be discussed further below, the etch process is continued until an endpoint is detected via the gas analyzer.

Many alternatives to the process scheme described above can be used. Additional gas sources and chambers, for example, can be utilized. For example, depending upon the diluent(s) used (gas sources 16 and 18), a plurality of diluent sources (N2, Ar, He, etc.) can be connected to the expansion chamber and/or to the recirculation loop for bleeding the system after an etch. The air distribution system within the etching chamber can also be varied, for example by including U-shaped or cone-shaped baffles, or by using additional perforated plates and/or baffles.

Figure 13:
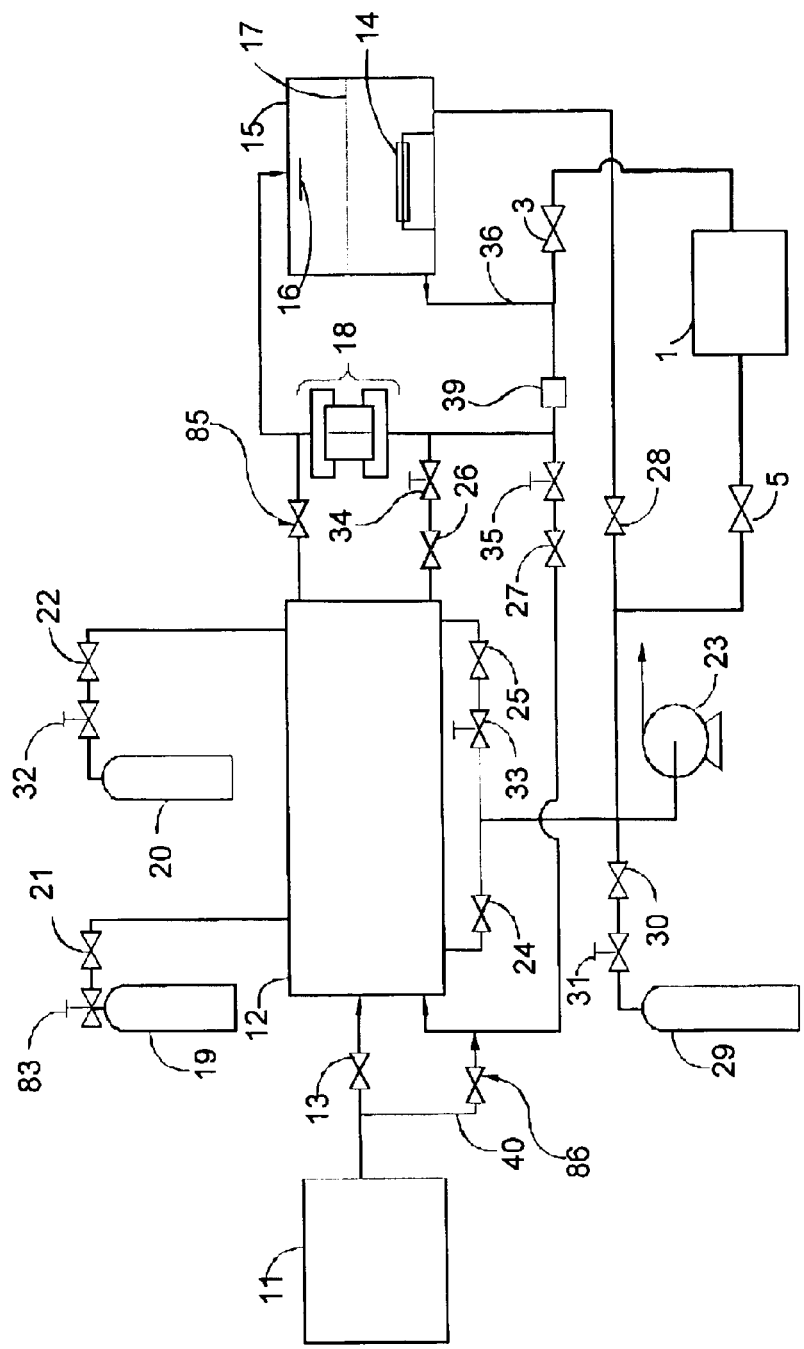
FIG. 13 is a diagram showing another exemplary etching system used in the embodiments of the invention.

A specific alternative to the embodiment of FIG. 12 is illustrated in FIG. 13. FIG. 13 represents such a process flow arrangement in which the process is an etching process having a detectable end point. The etchant gas originates in a source chamber 11. An example of an etchant gas that is conveniently evaporated from a liquid is bromine trifluoride, whereas an example of an etchant gas that is conveniently sublimated from solid crystals is xenon difluoride. Effective results can be achieved by maintaining the crystals under 40 degrees C. (e.g. at a temperature of 28.5° C.). (Xenon difluoride is only one of several etchant gases that can be used. Examples of other gases are presented below.) The sublimation pressure of xenon difluoride crystals at 28.5° C. is 5–11 mbar (4–8 torr). An expansion chamber 12 receives xenon difluoride gas from the crystals in the source chamber (s) 11, and a shutoff valve 13 is positioned between the source and expansion chambers. The sample 14 to be etched is placed in an etch chamber 15 (which contains a baffle 16 a perforated plate 17), and a reciprocating pump 18 that is positioned between the expansion chamber 12 and the etch chamber 15. (The reciprocating pump and its valves are shown in more detail in a FIGS. 3a and 3b and described below.) Also illustrated in FIG. 12, and will be discussed further below, is a gas analyzer 1 with valves 3 and 5 that control the flow of gas from the etching chamber through the gas analyzer.

Also shown are two individual gas sources 19, 20 supplying the expansion chamber 12 through shutoff valves 21, 22, a vacuum pump 23 and associated shutoff valves 24, 25, 26, 27, 28 to control the evacuation of the chambers, a third gas source 29 serving as a pump ballast with an associated shutoff valve 30 to prevent backstreaming from the pump 23, and manually operated needle valves 31, 32, 33, 34, 35, 83 to set the gas flow rates through the various lines and to permit fine adjustments to the pressures in the chambers. When xenon difluoride is used, the expansion chamber 12 and the etch chamber 15 are typically maintained at around room temperature (e.g. 25.0° C.). However, the expansion chamber and etch chamber could also be heated (e.g. to between 25 and 40 degrees C.), though this would likely be performed in conjunction with directly cooling the sample being processed, as will be discussed below. A recirculation line 36 permits gas to flow continuously through the etch chamber 15 in a circulation loop that communicates (via valves 26, 27, and 34, 35) with the expansion chamber 12 and reenters the etch chamber 15 by way of the reciprocating pump 18. Valve 85 permits gas transfer between expansion chamber 12 and etch chamber 15 via a portion of the recirculation line 36 without traversing recirculation pump 18. Valve 86 in path 40 permits introduction of etchant gas into the expansion chamber 12 to replenish the etchant mixture during the etching process. The valves are preferably corrosive gas resistant bellows-sealed valves, preferably of aluminum or stainless steel with corrosive resistant O-rings for all seals (e.g. Kalrez™ or Chemraz™). The needle valves are also preferably corrosion resistant, and preferably all stainless steel. A filter 39 could be placed in the recirculation line 36 to remove etch byproducts from the recirculation flow (though preferably not the product(s)

being monitored for end point detection), thereby reducing the degree of dilution of the etchant gas in the flow. The filter can also serve to reduce the volume of effluents from the process.

The etch chamber 15 can be of any shape or dimensions, but the most favorable results will be achieved when the internal dimensions and shape of the chamber are those that will promote even and steady flow with no vortices or dead volumes in the chamber interior. A preferred configuration for the etch chamber is a circular or shallow cylindrical chamber, with a process gas inlet port at the center of the top of the chamber, plus a support in the center of the chamber near the bottom for the sample, and an exit port in the bottom wall or in a side wall below the sample support. The baffle 16 is placed directly below the entry port. The distance from the port to the upper surface of the baffle is not critical to this invention and may vary, although in preferred embodiments of the invention the distance is within the range of from about 0.1 cm to about 6.0 cm, and most preferably from about 0.5 cm to about 3.0 cm. Although its shape is not shown in FIG. 12, the baffle is preferably circular or otherwise shaped to deflect the gas stream radially over a 360° range. The perforated plate 17 is wider than the baffle 16 and preferably transmits all gas flow towards the sample. A preferred configuration for the perforated plate is one that matches the geometry of the sample; thus, for a circular sample the perforated plate is preferably circular as well.

Figure 14A:
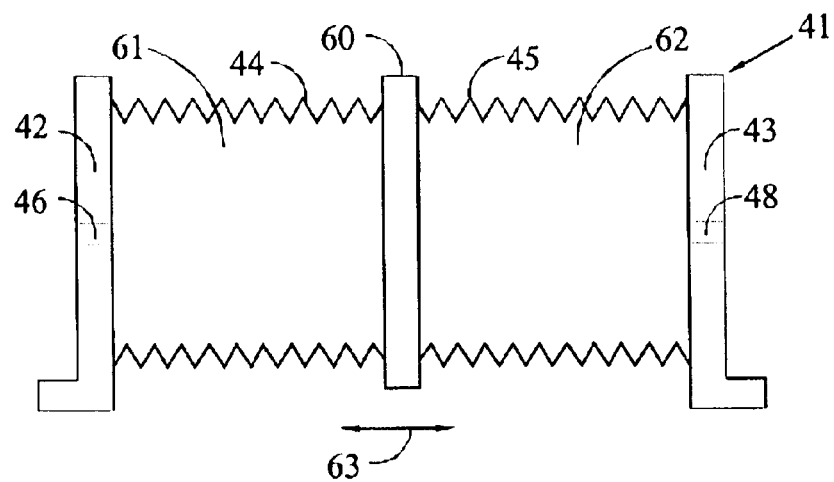
FIG. 14a is a side elevation view of an exemplary reciprocating pump for use in the exemplary etching system of FIG. 13.
Figure 14B:
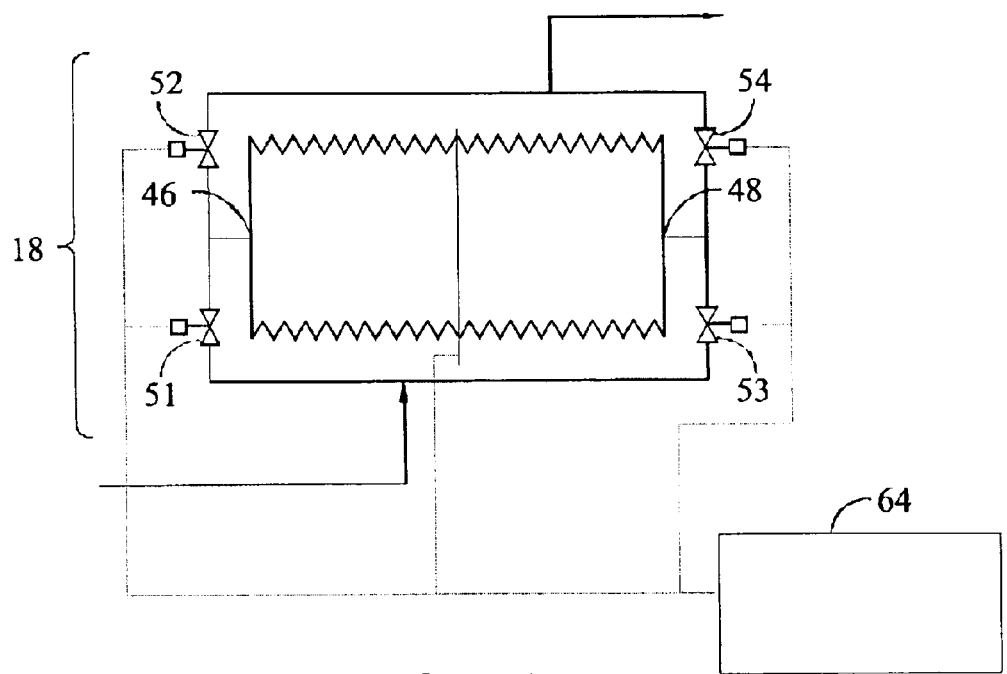
FIG. 14b is a pump flow diagram of the reciprocating pump of FIG. 14a together with associated flow lines and shutoff valves.

FIG. 14a and FIG. 14b are diagrams of an example of a reciprocating pump 18 that can be used in the practice of this invention. The design shown in these diagrams can be varied in numerous ways, such as by increasing the number of chambers to three or more, or by arranging a series of such pumps in parallel. The following discussion is directed to the particular design shown in these diagrams.

The side elevation view of FIG. 14a shows the pump housing 41, which consists of two stationary end walls 42, 43 joined by bellows-type side walls 44, 45. The bellows-type side walls 44, 45 are so-called because they are either pleated like an accordion or otherwise constructed to permit bellows-type expansion and contraction. The end walls 42, 43 and the bellows-type side walls 44, 45 together fully enclose the interior of the pump except for inlet/outlet ports on each side wall. The arrangement of these ports is shown in the pump flow diagram of FIG. 3b, the left side wall 42 having one inlet/outlet port 46, and the right side wall 43 likewise having one inlet/outlet port 48. Remotely controlled shutoff valves 51, 52, 53, 54 are placed on the external lines leading to or from each inlet/outlet port. For fail-safe operation, shutoff valves 51, 54 are normally open and shutoff valves 52, 53 are normally closed.

The movable partition 60 shown in FIG. 14a divides the pump interior into two chambers 61, 62, the partition and its connections to the remaining portions of the housing being fluid-impermeable so that the two chambers are completely separate with no fluid communication between them. The partition 60 joins the bellows-type side walls 44, 45 and moves in the two directions indicated by the two-headed arrow 63. The movement is driven by a suitable drive mechanism (not shown) capable of reciprocating movement. Many such drive mechanisms are known to those skilled in the art and can be used. In the view shown in FIG. 3a, movement of the partition to the left causes the left chamber 61 to contract and the right chamber 62 to expand. With the pump shutoff valves appropriately positioned, i.e., valves 52 and 53 open and valves 51 and 54 closed, the contracting left chamber 61 will discharge its contents through its inlet/outlet port 46 while the expanding right chamber 62 will draw gas in through its inlet/outlet port 48. Once the partition 60 has reached the end of its leftward travel, it changes direction and travels to the right and the shutoff valves are switched appropriately, causing the expanded right chamber 62 to contract and discharge its contents through its inlet/outlet port 48 while the contracted left chamber 61 expands and draws fresh gas in through its inlet/outlet port 46. In this manner, the pump as a whole produces a gas flow in a substantially continuous manner, the discharge coming alternately from the two chambers. A controller 64 governs the direction and range of motion, and the speed and cycle time of the partition 60, and coordinates the partition movement with the opening and closing of the shutoff valves 51, 52, 53, and 54. Conventional controller circuitry and components can be used.

The pump for recirculating the process gas as shown, and others within the scope of this invention, has no sliding or abrading parts or lubricant that come into contact with the process gas. Alternative pumps that meet this criterion are possible, including pumps with expandable balloon chambers, pumps with concentric pistons connected by an elastic sealing gasket, or peristaltic pumps. The pump materials, including the bellows-type walls, can thus be made of materials that are resistant or impervious to corrosion from the etchant gas. One example of such a material, useful for operating temperatures below 50° C., is stainless steel. Others are aluminum, Inconel, and Monel. Still others will be readily apparent to those experienced in handling these gases. While the capacity and dimensions of the pump and its chambers may vary, a presently preferred embodiment is one in which the change in volume of each chamber upon the movement of the partition across its full range is approximately from 0.05 to 4.2 L, though preferably from 0.1 to 1.5 L, with one example being 0.5 L. Larger chamber sizes (e.g. 5 to 20 L) are possible, which, if combined with a slower pumping speed, can benefit from lower wear on the pump. At a partition speed of one cycle every two seconds, the pump rate (for 0.5 L) will be 30 L/min. Different combinations of pump sizes and pump speeds are possible, though the preferred pump volume per time is between 7 and 150 L/min, with a preferred range of from 30 to 90 L/min.

The pump described above can be lined with a suitable lining to further reduce particulate contamination of the process gas mixture during etching. Pumps that are not of the bellows type can also be used. The preferred pumps are those that are resistant to corrosion by the process gas mixture and those that are designed to avoid introducing particulate or liquid material into the process gas mixture. Dry pumps, i.e., those that do not add exogenous purge or ballast gas into the process gas mixture, are preferred. Alternatively, the process gas could be circulated by temperature cycling (with large variations in the heating and cooling of the recirculation path).

The following is a generalized description of the etching process and its chemical parameters in relation to FIG. 13. This description is included to show the context in which the features described above are most likely to be used.

The apparatus and methods of this invention can be used in etching processes that are known in the art and in the literature. These processes include the use of dry-etch gases in general, including $Cl_2$, HBr, HF, $CCl_2F_2$ and others. Preferred etchant gases, particularly for etching silicon, are gaseous halides (e.g. fluorides) such as noble gas fluorides, gaseous halogen fluorides, or combinations of gases within these groups (again, preferably without energizing the gas, other than heating to cause vaporization or sublimation). The noble gases are helium, neon, argon, krypton, xenon and radon, and among these the preferred fluorides are fluorides of krypton and xenon, with xenon fluorides the most preferred. Common fluorides of these elements are krypton difluoride, xenon difluoride, xenon tetrafluoride, and xenon hexafluoride. The most commonly used noble gas fluoride in silicon etch procedures is xenon difluoride. Halogen fluorides include bromine fluoride, bromine trifluoride, bromine pentafluoride, chlorine fluoride, chlorine trifluoride, chlorine pentafluoride, iodine pentafluoride and iodine heptafluoride. Preferred among these are bromine trifluoride, bromine trichloride, and iodine pentafluoride, with bromine trifluoride and chlorine trifluoride the more preferred. Combinations of bromine trifluoride and xenon difluoride are also of interest. The etch process is generally performed at a pressure below atmospheric. It is preferred that the etchants described herein be used in the gaseous state (e.g. non-plasma) or otherwise in the absence of added energy (except heat to aid sublimation or vaporization of the starting etchant gas or liquid), and in the absence of electric fields, UV light or other electromagnetic energy, or other added fields or energy sources which would energize the etchant gas beyond it's normal energy as a gas at a particular temperature.

The etch preferably utilizes an etchant gas capable of spontaneous chemical etching of the sacrificial material at room temperature, preferably isotropic etching that chemically (and not physically) removes the sacrificial material. In a preferred embodiment, the etchant is capable at room temperature of reacting with the sacrificial material and where the reaction product(s) is a gaseous component that is released from the sacrificial material surface due to being in a gaseous state. No UV or visible light or other electromagnetic radiation or electric fields are needed, or any energy that would energize the gas molecules to physically bombard and physically remove the sacrificial material. Though the etch could be performed with the application of heat or the presence of light from the room surrounding the etch chamber, the etchant is capable of spontaneously etching the sacrificial material at room temperature without any applied heat, visible, UV or other electromagnetic radiation, ultrasonic energy, electric or magnetic fields, etc. The etchant is preferably not broken down into atoms, radicals and/or ions by an rf glow discharge, the etchant is transported by diffusion to the surface of the material being etched (in addition to pumping—e.g. by recirculating the etchant repeatedly through the etching chamber), the etchant is adsorbed on the surface, a chemical reaction occurs between the etchant and the material being etched with the formation of a volatile product, and the product is desorbed from the surface and diffuses into the bulk of the gas and eventually exits the etching chamber. The apparatus, therefore, can be without a source of RF or microwave energy, though it is possible to run the process of the invention in a plasma apparatus without energizing the etchant to form a plasma.

Taking as an example BrCl3, a molecule of BrCl3 could hypothetically be placed next to a silicon molecule bound to other silicon molecules in crystalline silicon, polysilicon or in an amorphous silicon matrix. The bond energies of the Cl atoms to the Br atoms are sufficiently weak, and the bond energy of the silicon atom to other silicon atoms is sufficiently weak, and the attraction forces between Si and Cl are sufficiently strong, that without a physical bombardment of the BrCl3 on the silicon, Cl will disassociate from Br and bond to Si to form various products such as SiCl, SiCl2, SiCl3, SiCl4, etc., which etch products are a gas a room temperature and dissipate from the silicon surface, thus removing sacrificial silicon material. The same process occurs with XeF2, BrF3 and the other vapor phase spontaneous chemical etchants.

Such chemical etching and apparatus for performing such chemical etching are disclosed in U.S. patent application Ser. No. 09/427,841 to Patel et al. filed Oct. 26, 1999, in U.S. patent application Ser. No. 09/649,569 to Patel at al. filed Aug. 28, 2000, mentioned previously, and in U.S. patent application Ser. No. 60/293,092 to Patel et al. filed May 22, 2001 incorporated herein by reference. Preferred etchants for the etch are gas phase fluoride etchants that, except for the optional application of temperature, are not energized. Examples include gaseous acid etchants (HF, HCl, HI etc.), noble gas halides such as XeF2, XeF6, KrF2, KrF4 and KrF6, and interhalogens such as IF5, BrCl3, BrF3, IF7 and ClF3. It is also possible to use fluorine gas, though handling of fluorine gas makes this a less desirable option. The etch may comprise additional gas components such as N2 or an inert gas (Ar, Xe, He, etc.). In the etching process, except for optional heating, the gas is not energized and chemically etches the sacrificial material isotropically. In this way, the sacrificial material is removed and the micromechanical structure is released. In one aspect of such an embodiment, BrF3 or XeF2 are provided in a chamber with diluent (e.g. N2 and He). An initial plasma etch, preferably in a separate etching apparatus, can be performed prior to etching as set forth above. This sequential etch is set forth further in U.S. patent application Ser. No. 60/293,092 to Patel et al. filed May 22, 2001, the subject matter of which is incorporated herein by reference.

Figure 15:
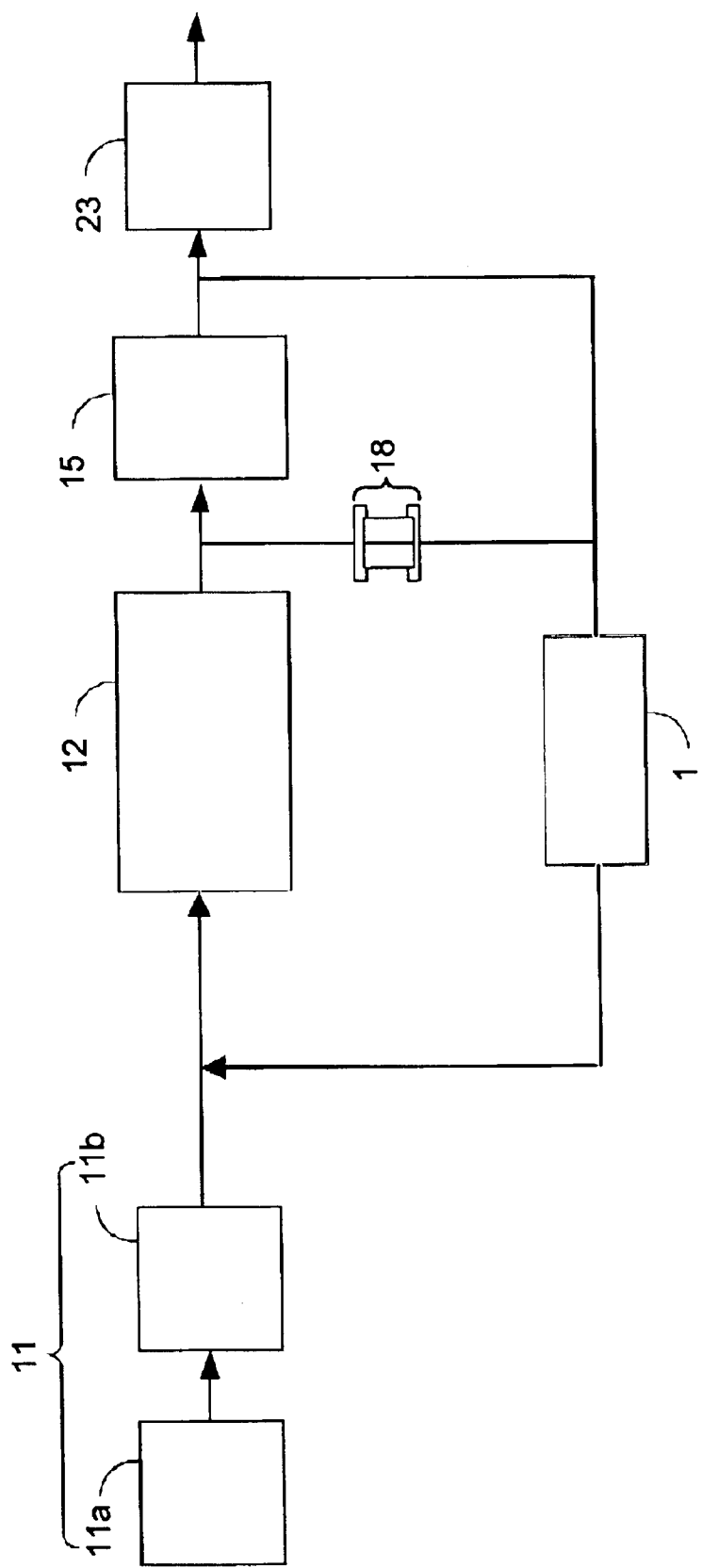
FIG. 15 is another exemplary etching system used in the embodiments of the present invention.

While the source chamber 11 can be a single chamber, the arrangement shown in FIG. 15 is an optional one in which the source chamber is actually a pair of chambers 11a and 11b arranged in series. The first of these chambers 11a contains the source material primarily in its condensed form, i.e., either as crystals to be sublimated or liquid to be vaporized. The second chamber 11b receives the source material gas evolved by sublimation from the crystals or by vaporization from the liquid in the first chamber 11a. To maintain these phases, the two chambers 11a and 11b will preferably be maintained at different temperatures (preferably at least 5 degrees C. difference), the former 11a at the lower temperature to keep the material in its condensed form (solid crystals or liquid) and the latter 11b at the higher temperature (and possibly a higher pressure as well) to keep the material in the vapor form (and to avoid the problem of condensation) at a pressure sufficiently high to allow it to be supplied to the succeeding chambers at the pressures needed in those chambers. In one embodiment, the two chambers are held at temperatures above room temperature, with chamber 11b held at a temperature from 2 to 24 degrees C. (preferably around 5 to 10 degrees C.) higher than the temperature of chamber 11a. Such a two-chamber embodiment could likewise be utilized in a system such as that illustrated in FIG. 12. Chambers 11a and 11b could also be arranged in parallel. Also shown in FIG. 15 are the expansion chamber 12, the etching chamber 15, pumps 18 and 23 and gas analyzer 1.

The terms "sample" and "microstructure" are used herein to denote the article from which a material is sought to be removed or to which a material is to be added, whether the material forms a layer among a plurality of layers, layers among a plurality of layers or a region adjacent to other regions in the same plane. The "sample" may thus be a single mirror element and its associated layers of other materials, a test pattern, a die, a device, a wafer, a portion of a wafer, or any article from which a portion is to be removed or added. The invention is particularly suitable for processes where the size of the portion of material that is being added or removed is less than 5 mm in at least one of its dimensions, preferably less than 1 mm, more preferably less than 500 μm, and most preferably less than 100 μm. The invention is also well suited to adding or removing material (e.g., in the form of holes or layers) in a submicron environment (e.g. in the range of 10 nm to less than 100 nm) (as sometimes needed, for example, in MEMS and MOEMS).

In the system depicted in the drawings, as well as other systems within the scope of this invention, a single charge of etchant can be placed in the source chamber or the expansion chamber, then released (with or without diluents) into the recirculation loop. Additional etchant can be introduced to replenish the circulating stream as the amount of etchant in the recirculation loop decreases over time. Other variations of the process will be apparent to those skilled in the art.

When the material to be removed by etching is silicon, certain etching processes supply the etchant gas as a mixture of gases of which one component is the etchant gas itself (or a mixture of etchant gases) while other components are non-etchant diluents. Whether the gas consists entirely of etchant gas(es) or contains non-etchant components as well, the rate of the etch reaction may vary with the partial pressure of the etchant gas. The pressure may vary, but in most applications, particularly those in which silicon is being etched, best results will be obtained with the etchant gas at a partial pressure of at least about 0.01 mbar (0.0075 torr), preferably at least 0.1 Torr, more preferably within the range of from about 1 to 760 Torr, and most preferably from about 50 to 600 Torr. These pressure ranges are particularly applicable to xenon difluoride etching.

In certain processes, non-etchant gas additive(s) are included to increase the selectivity of the silicon etch. Preferred additives for this purpose are non-halogen-containing gases. A single such additive or a mixture of such additives can be used. In preferred embodiments of this invention, the additives are those whose molar-averaged formula weight (expressed in daltons or grams per mole) is less than the formula weight of molecular nitrogen, preferably about 25 or less, still more preferably within the range of from about 4 to about 25, still more preferably within the range of from about 4 to about 20, and most preferably within the range of from about 4 to about 10. If a single additive species is used, the "molar-averaged formula weight" is the actual formula weight of that species, whereas if two or more additive species are used in the same gas mixture, the molar-averaged formula weight is the average of the formula weights of each species in the mixture (exclusive of the noble gas fluoride) calculated on the basis of the relative molar amounts (approximately equal to the partial pressures) of each species. In terms of thermal conductivity, preferred additives are those whose thermal conductivity at 300 K (26.9° C.) and atmospheric pressure ranges from about 10 mW/(m K) (i.e., milliwatts per meter per degree Kelvin) to about 200 mW/(m K), and most preferably from about 140 mW/(m K) to about 190 mW/(m K). In general, the higher the thermal conductivity of the additive, the greater the improvement in selectivity. Examples of additives suitable for use in this invention are nitrogen (N2, thermal conductivity at 300 K: 26 mW/(m K)), argon (Ar, thermal conductivity at 300 K: 18 mW/(m K)), helium (He, thermal conductivity at 300 K: 160 mW/(m K)), neon (Ne, thermal conductivity at 300 K: 50 mW/(m K)), and mixtures of two or more of these gases. Preferred additive gases are helium, neon, mixtures of helium and neon, or mixtures of one or both of these with one or more non-etchant gases of higher formula weight such as nitrogen and argon. Particularly preferred additives are helium and mixtures of helium with either nitrogen or argon.

The degree of selectivity improvement may vary with molar ratio of the additive to the etchant gas. Here again, the molar ratio is approximately equal to the ratio of the partial pressures, and in this case the term "molar ratio" denotes the ratio of the total number of moles of the additive gas (which may be more than one species) divided by the total number of moles of the etchant gas (which may also be more than one species). In most cases, best results will be obtained with a molar ratio of additive to etchant that is less than about 500:1, preferably within the range of from about 1:1 to about 500:1, preferably from about 10:1 to about 200:1, and most preferably from about 20:1 to about 150:1. In one example, the ratio is set at 125:1.

The temperature at which the etch process is conducted can likewise vary, although the partial pressure of the etchant gas will vary with temperature. The optimal temperature may depend on the choice of etchant gas, gaseous additive or both. In general, and particularly for procedures using xenon difluoride as the etchant gas, suitable temperatures will range from about −60° C. to about 120° C., preferably from about −20° C. to about 80° C., and most preferably from about 0° C. to about 60° C. For xenon difluoride, the silicon etch rate is inversely proportional to the temperature over the range of −230° C. to 60° C. The improvement in selectivity can thus be further increased by lowering the etch process temperature.

The flow parameters will be selected such that the time during which the sample will be exposed to the etchant gas will be sufficient to remove all or substantially all of the silicon. By "silicon" it is meant any type of silicon, including amorphous silicon, single crystal silicon and polysilicon, which silicon can have up to 40 at % or more (typically from 5 to 25 at %) hydrogen depending upon the deposition technique, as well as impurities that can result from the target or atmosphere. The expression "substantially all of the silicon" is used herein to denote any amount sufficient to permit the finished product to function essentially as effectively as if all of the silicon had been removed. An example of the structures to which this invention will be applied is that depicted in U.S. Pat. No. 5,835,256, in which a silicon nitride layer is deposited over a polysilicon layer, and the silicon nitride layer is patterned to leave vias that define the lateral edges of the mirror elements. Access to the sacrificial polysilicon layer is through the vias, and the etching process removes the polysilicon below the vias by etching in the vertical direction (i.e., normal to the planes of the layers) while also removing the polysilicon underneath the silicon nitride by etching in the lateral direction (parallel to the planes of the layers). The process is also effective for etching silicon relative to multiple non-silicon layers. Also, it should be noted that the silicon can contain impurities, and in particular may contain a large amount of hydrogen (e.g. up to 25 at % or more) depending upon the deposition method used.

It will be appreciated by those of skill in the art that a new and useful method for fabricating microelectromechanical devices has been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. In particular, the removable barrier layer(s) and the sacrificial layers may be removed by one etching step. Rather, the barrier layer(s) and the sacrificial layers can be removed using separate etching steps. For another example, the Sandia SUMMIT process (using polysilicon for structural layers) or the Cronos MUMPS process (also polysilicon for structural layers) could be used in the present invention. Also, a MOSIS process (AMI ABN −1.5 um CMOS process) could be adapted for the present invention. Also, the sacrificial layer and etchant disclosed herein are exemplary only. For example, a silicon dioxide sacrificial layer could be used and removed with HF (or HF/HCl), or a silicon sacrificial could be removed with $ClF_3$ or $BrF_3$. Also a PSG sacrificial layer could be removed with buffered HF, or an organic sacrificial such as polyimide could be removed in a dry plasma oxygen release step. Of course the etchant and sacrificial material should be selected depending upon the structural material to be used. Also, though PVD and CVD are referred to above, other thin film deposition methods could be used for depositing the layers, including spin-on, sputtering, anodization, oxidation, electroplating and evaporation. Therefore, the invention as described herein contemplates all such embodiments as may come within the scope of the following claims and equivalents thereof.

We Claim:

1. A method comprising:
   depositing a first sacrificial layer;
   depositing a first barrier layer after the first sacrificial layer;
   forming a structural layer of a microelectromechanical device after the first barrier layer;
   releasing the microelectromechanical device by removing the first sacrificial layer and the first barrier layer; and
   wherein the first barrier layer prevents diffusion and reaction between the first sacrificial layer and the structural layer.

2. The method of claim 1, further comprising:
   before releasing the microelectromechanical device by removing the first sacrificial layer and the first barrier layer,
      depositing a second barrier layer after the structural layer formed on the first barrier layer;
      depositing a second sacrificial layer after the second barrier layer;
      forming one or more structure layers of the microelectromechanical device after the second sacrificial layer; and
      wherein the second barrier layer prevents diffusion and interaction between the second sacrificial layer and the structural layer formed underneath the second barrier layer; and
   wherein the step of releasing the microelectromechanical device by removing the first sacrificial layer and the first barrier layer further comprises:
      removing the second sacrificial layer and the second barrier layer.

3. The method of claim 2, wherein the second sacrificial material is amorphous silicon; and wherein the structural layer formed on the first sacrificial layer is a metal element or a metal compound.

4. The method of claim 2, wherein the second barrier layer comprises one or more early transition metal elements.

5. The method of claim 4, wherein the non-etchant gaseous addictive is inert gas.

6. The method of claim 5, wherein the noble gas halide is xenon difluoride.

7. The method of claim 2, wherein the second barrier layer comprises one or more early transition metal alloys.

8. The method of claim 2, wherein the second barrier layer comprises one or more early transition metal compounds.

9. The method of claim 2, wherein the removal of the second sacrificial layer and the second barrier layer is achieved by etching the second sacrificial layer and the second barrier layer using isotropic gas-phase etching technique with non-plasma spontaneous chemical vapor-phase etchant.

10. The method of claim 2, wherein the microelectromechanical device is a micromirror device; and the method further comprising:
    before depositing the first sacrificial layer,
       providing a substrate, on which the first sacrificial layer is deposited;
    wherein the step of forming the structure layer of the microelectromechanical device on the first sacrificial layer further comprises:
       depositing the structure layer, wherein the structure layer has a reflectivity to visible light higher than ninety percent (90%); and
       patterning the deposited structural layer into a micromirror plate of the micromirror device for reflecting incident visible light; and
    wherein the one or more structural layers on the second sacrificial layer are formed into a hinge, to which the micromirror plate of the micromirror device is attached such that the micromirror plate can rotate relative to the substrate after releasing the micromirror device.

11. The method of claim 2, wherein the second barrier layer neither diffuses into nor interacts with the first structural layer under 400° C. (degree) within 30 minutes.

12. The method of claim 1, further comprising:
    before releasing the microelectromechanical device by removing the first sacrificial layer and the first barrier layer,
       depositing a second barrier layer after the structural layer formed on the first barrier layer;
       depositing a second sacrificial layer after the second barrier layer;
       forming one or more structural layers of the microelectromechanical device after the second sacrificial layer; and
       wherein the second barrier layer prevents diffusion and interaction between the second sacrificial layer and the structure layer formed underneath the second barrier layer; and
    wherein the step of releasing the microelectromechanical device by removing the first sacrificial layer and the first barrier layer further comprises:
       removing the second sacrificial layer; and
    wherein the second barrier layer is not removed after releasing the microelectromechanical device.

13. The method of claim 12, wherein the second sacrificial material is amorphous silicon; and wherein the structure layer formed on the first sacrificial layer is a metal element or a metal compound.

14. The method of claim 12, wherein the second barrier layer comprises one or more inter-metallic metal compounds.

15. The method of claim 14, wherein the non-etchant gaseous additive is inert gas.

16. The method of claim 12, wherein the second barrier layer comprises one or more early transition metal nitrides.

17. The method of claim 12, wherein the second barrier layer comprise one or more early transition metal oxides.

18. The method of claim 12, wherein the second barrier layer comprise one or more early transition metal oxynitrides.

19. The method of claim 18, wherein the micromirror device is part of a micromirror array of a spatial light modulator.

20. The method of claim 18, wherein the substrate is transparent to visible light.

21. The method of claim 18, wherein the substrate is a silicon wafer.

22. The method of claim 12, wherein the second barrier layer comprise one or more early transition metal silicon nitrides.

23. The method of claim 22, wherein the spatial light modulator is part of a display system that further comprises:
a light source for providing visible light; and
one or more optical elements for directing the visible light onto the spatial light modulator.

24. The method of claim 12, wherein the removal of the second sacrificial layer is achieved by etching using isotropic gas-phase etching technique with non-plasma spontaneous chemical vapor-phase etchant.

25. The method of claim 24, wherein the display system further comprises:
one or more optical elements for directing reflected light from the spatial light modulator onto a display target.

26. The method of claim 12, further comprises: after depositing the second barrier layer, patterning the deposited second barrier layer according to the structural layer.

27. The method of claim 12, further comprising:
patterning the second barrier layer.

28. The method of claim 12, wherein the microelectromechanical device is a micromirror device; and the method further comprising:
before depositing the first sacrificial layer,
providing a substrate, on which the first sacrificial layer is deposited;
wherein the step of forming the structure layer of the microelectromechanical device on the first sacrificial layer further comprises:
depositing the structure layer, wherein the structure layer has a reflectivity to visible light higher than ninety percent (90%); and
patterning the deposited structural layer into a micromirror plate of the micromirror device for reflecting incident visible light; and
wherein the one or more structural layers on the second sacrificial layer are formed into a hinge, to which the micromirror plate of the micromirror device is attached such that the micromirror plate can rotate relative to the substrate after releasing the micromirror device.

29. The method of claim 12, wherein the second barrier layer neither diffuses into nor interacts with the first structural layer under 400° C. (degree) within 30 minutes.

30. The method of claim 1, wherein the first sacrificial material is amorphous silicon; and wherein the structural layer formed on the first sacrificial layer is a metal element or a metal compound.

31. The method of claim 1, wherein the first barrier layer comprises one or more early transition metal elements.

32. The method of claim 31, wherein the early transition metal element is molybdenum.

33. The method of claim 31, wherein the early transition metal element is tungsten.

34. The method of claim 31, wherein the early transition metal element is tantalum.

35. The method of claim 34, wherein the early transition metal compound is early transition metal silicides.

36. The method of claim 31, wherein the early transition metal element is titanium.

37. The method of claim 1, wherein the first barrier layer comprises one or more early transition metal alloys.

38. The method of claim 1, wherein the first barrier layer comprises one or more early transition metal compounds.

39. The method of claim 38, wherein the early transition metal compound is early transition metal silicide.

40. The method of claim 39, wherein the early transition metal silicide is molybdenum silicide.

41. The method of claim 39, wherein the early transition metal silicide is tungsten silicide.

42. The method of claim 41, wherein the chemical vapor-phase etchant is vapor-phase interhalogen.

43. The method of claim 41, wherein the chemical vapor-phase etchant is vapor-phase noble gas halide.

44. The method of claim 41, wherein the chemical vapor-phase etchant is a mixture of noble gas halide and one or more non-etchant gaseous additives.

45. The method of claim 39, wherein the early transition metal silicide is tantalum silicide.

46. The method of claim 39, wherein the early transition metal silicide is titanium silicide.

47. The method of claim 46, wherein the noble gas halide is xenon difluoride.

48. The method of claim 47, wherein the chemical vapor-phase etchant is vapor-phase interhalogen.

49. The method of claim 47, wherein the chemical vapor-phase etchant is vapor-phase noble gas halide.

50. The method of claim 49, wherein the micromirror device is part of a micromirror array of a spatial light modulator.

51. The method of claim 49, wherein the spatial light modulator is part of a display system that further comprises:
a light source for providing visible light; and
one or more optical elements for directing the visible light onto the spatial light modulator.

52. The method of claim 49, wherein the display system further comprises:
one or more optical elements for directing reflected light from the spatial light modulator onto a display target.

53. The method of claim 49, wherein the substrate is transparent to visible light.

54. The method of claim 49, wherein the substrate is a silicon wafer.

55. The method of claim 47, wherein the chemical vapor-phase etchant is a mixture of noble gas halide and one or more non-etchant gaseous additives.

56. The method of claim 1, wherein the step of releasing the microelectromechanical device by removing the first sacrificial layer and the first barrier layer further comprises:
etching the first sacrificial layer and the first barrier layer using isotropic gas-phase etching technique with non-plasma spontaneous chemical vapor-phase etchant.

57. The method of claim 56, wherein the chemical vapor-phase etchant is vapor-phase interhalogen.

58. The method of claim 57, wherein the noble gas halide is xenon difluoride.

59. The method of claim 56, wherein the chemical vapor-phase etchant is vapor-phase noble gas halide.

60. The method of claim 56, wherein the chemical vapor-phase etchant is a mixture of noble gas halide and one or more non-etchant gaseous additives.

61. The method of claim 60, wherein the non-etchant gaseous addictive is inert gas.

62. The method of claim 1, wherein the first barrier layer is different from the first sacrificial layer.

63. The method of claim 1, wherein the first barrier layer neither diffuses into nor interacts with the first structural layer under 400° C. (degree) within 30 minutes.

* * * * *